United States Patent
Cooley et al.

(10) Patent No.: US 10,054,154 B2
(45) Date of Patent: Aug. 21, 2018

(54) BEARING APPARATUS INCLUDING TILTING PADS

(71) Applicant: US SYNTHETIC CORPORATION, Orem, UT (US)

(72) Inventors: Craig H. Cooley, Saratoga Springs, UT (US); Timothy N. Sexton, Bettendorf, IA (US)

(73) Assignee: US SYNTHETIC CORPORATION, Orem, UT (US)

( * ) Notice: Subject to any disclaimer, the term of this patent is extended or adjusted under 35 U.S.C. 154(b) by 0 days.

(21) Appl. No.: 15/600,529

(22) Filed: May 19, 2017

(65) Prior Publication Data
US 2017/0254358 A1    Sep. 7, 2017

Related U.S. Application Data

(63) Continuation of application No. 14/464,289, filed on Aug. 20, 2014, now Pat. No. 9,702,400, which is a
(Continued)

(51) Int. Cl.
*F16C 17/06* (2006.01)
*F16C 33/26* (2006.01)
(Continued)

(52) U.S. Cl.
CPC ............... *F16C 17/06* (2013.01); *E21B 4/003* (2013.01); *F16C 17/03* (2013.01); *F16C 33/043* (2013.01);
(Continued)

(58) Field of Classification Search
CPC ........ F16C 17/03; F16C 17/06; F16C 33/043; F16C 33/26; F16C 43/02; F16C 2206/04;
(Continued)

(56) References Cited

U.S. PATENT DOCUMENTS 3,033,031 A    5/1962 Gruber
3,087,330 A    4/1963 Metzmeier
(Continued)

FOREIGN PATENT DOCUMENTS

DE    102005009298 A1 *  9/2006  ............... B27N 3/24
EP    1199484 A2 *  4/2002  ............... F01P 7/046
(Continued)

OTHER PUBLICATIONS

U.S. Appl. No. 13/089,725, filed Apr. 19, 2011, Cooley et al.
(Continued)

*Primary Examiner* — Marcus Charles
(74) *Attorney, Agent, or Firm* — Dorsey & Whitney LLP

(57) ABSTRACT

Tilting pad bearing assemblies and apparatuses are disclosed. The disclosed tilting pad bearing assemblies and apparatuses may be employed in downhole motors of a subterranean drilling system or other mechanical systems. In an embodiment, a bearing assembly or apparatus includes a support ring and a plurality of tilting pads. Each tilting pad is tilted and/or tiltably secured relative to the support ring. In some embodiments, one or more of the tilting pads include a plurality of superhard bearing segments assembled to form a superhard bearing surface. One or more seams may be positioned between adjacent superhard bearing segments of the superhard bearing segments. In other embodiments, one or more of the tilting pads may include at least one or only one superhard bearing segment, such as a polycrystalline diamond bearing segment.

20 Claims, 10 Drawing Sheets

US 10,054,154 B2
Page 2

Related U.S. Application Data continuation of application No. 14/012,663, filed on Aug. 28, 2013, now Pat. No. 8,840,309, which is a continuation of application No. 13/791,052, filed on Mar. 8, 2013, now Pat. No. 8,545,104, which is a continuation of application No. 13/089,725, filed on Apr. 19, 2011, now Pat. No. 8,545,103.

(51) Int. Cl.
| | | |
|---|---|---|
| *E21B 4/00* | (2006.01) | |
| *F16C 43/02* | (2006.01) | |
| *F16C 17/03* | (2006.01) | |
| *F16C 33/04* | (2006.01) | |
| *C23C 16/30* | (2006.01) | |

(52) U.S. Cl.
CPC ............. *F16C 33/26* (2013.01); *F16C 43/02* (2013.01); *C23C 16/30* (2013.01); *F16C 2206/04* (2013.01); *F16C 2352/00* (2013.01)

(58) Field of Classification Search
CPC ...... F16C 2352/00; E21B 4/003; C23C 16/30; C23C 16/32
USPC ..... 384/92, 95, 97, 105, 121–122, 223–224, 384/248, 261, 306, 308–309, 312, 625, 384/912; 175/337, 371; 427/249.1, 427/249.7, 249.13, 255.28, 249.2; 394/913
See application file for complete search history.

(56) References Cited

U.S. PATENT DOCUMENTS

| | | | |
|---|---|---|---|
| 3,201,184 A | 8/1965 | Hill | |
| 3,436,133 A | 4/1969 | Newell | |
| 3,745,623 A | 7/1973 | Wentorf, Jr. et al. | |
| 3,814,487 A | 6/1974 | Gardner | |
| 3,817,586 A | 6/1974 | Elwell | |
| 3,887,245 A | 6/1975 | Rouch | |
| 4,026,613 A * | 5/1977 | Moravchik | F16C 17/06 384/308 |
| 4,077,682 A | 3/1978 | Gardner | |
| 4,097,094 A | 6/1978 | Gardner | |
| 4,268,276 A | 5/1981 | Bovenkerk | |
| 4,274,900 A | 6/1981 | Mueller et al. | |
| 4,296,976 A | 10/1981 | Heshmat | |
| 4,301,237 A * | 11/1981 | Burns | G03F 1/22 378/35 |
| 4,403,873 A | 9/1983 | Gardner | |
| 4,410,054 A | 10/1983 | Nagel et al. | |
| 4,456,391 A | 6/1984 | New | |
| 4,468,138 A | 8/1984 | Nagel | |
| 4,501,505 A | 2/1985 | Chambers et al. | |
| 4,525,083 A | 6/1985 | Pedersen | |
| 4,544,285 A | 10/1985 | Shapiro et al. | |
| 4,560,014 A | 12/1985 | Geczy | |
| 4,662,348 A | 5/1987 | Hall et al. | |
| 4,720,199 A | 1/1988 | Geczy et al. | |
| 4,729,440 A | 3/1988 | Hall | |
| 4,738,322 A | 4/1988 | Hall et al. | |
| 4,738,550 A | 4/1988 | Gardner | |
| 4,756,631 A | 7/1988 | Jones | |
| 4,764,036 A | 8/1988 | McPherson | |
| 4,811,801 A | 3/1989 | Salesky et al. | |
| 4,824,263 A | 4/1989 | Singh | |
| 4,913,247 A | 4/1990 | Jones | |
| 4,927,275 A | 5/1990 | Lawson | |
| 5,016,718 A | 5/1991 | Tandberg | |
| 5,046,864 A * | 9/1991 | Boller | F16C 17/06 384/306 |
| 5,068,965 A | 12/1991 | Ball et al. | |
| 5,092,687 A | 3/1992 | Hall | |
| 5,120,327 A | 6/1992 | Dennis | |
| 5,135,061 A | 8/1992 | Newton, Jr. | |
| 5,137,373 A | 8/1992 | Ide et al. | |
| 5,143,455 A | 9/1992 | Squyres | |
| 5,154,245 A | 10/1992 | Waldenstrom et al. | |
| 5,180,022 A | 1/1993 | Brady | |
| 5,288,153 A | 2/1994 | Gardner | |
| 5,342,129 A | 8/1994 | Dennis et al. | |
| 5,364,192 A | 11/1994 | Damm et al. | |
| 5,368,398 A | 11/1994 | Damm et al. | |
| 5,393,145 A | 2/1995 | Ide | |
| 5,460,233 A | 10/1995 | Meany et al. | |
| 5,480,233 A | 1/1996 | Cunningham | |
| 5,544,713 A | 8/1996 | Dennis | |
| 5,634,725 A * | 6/1997 | Chester | F16C 17/03 384/117 |
| 5,829,881 A * | 11/1998 | Furlani | B41J 29/02 384/42 |
| 6,183,138 B1 * | 2/2001 | New | F16C 17/06 384/308 |
| 6,190,050 B1 | 2/2001 | Campbell | |
| 6,443,621 B1 * | 9/2002 | New | F16C 17/06 384/122 |
| 6,500,488 B1 * | 12/2002 | Chang | C23C 16/274 423/446 |
| 6,736,542 B2 | 5/2004 | Hudson et al. | |
| 6,793,681 B1 | 9/2004 | Pope et al. | |
| 7,060,641 B2 | 6/2006 | Qian et al. | |
| 7,063,465 B1 | 6/2006 | Wilkes et al. | |
| 7,533,739 B2 | 5/2009 | Cooley et al. | |
| 7,552,782 B1 | 6/2009 | Sexton et al. | |
| 7,635,035 B1 | 12/2009 | Bertagnolli et al. | |
| 7,758,247 B2 * | 7/2010 | Geiger | F16C 17/03 384/309 |
| 7,845,855 B2 | 12/2010 | Bischof et al. | |
| 7,866,418 B2 | 1/2011 | Bertagnolli et al. | |
| 7,870,913 B1 | 1/2011 | Sexton et al. | |
| 7,901,137 B1 | 3/2011 | Peterson | |
| 7,942,218 B2 | 5/2011 | Cooley et al. | |
| 8,113,798 B2 | 2/2012 | Bosen | |
| 8,118,117 B2 | 2/2012 | Ide et al. | |
| 8,146,687 B1 | 4/2012 | Vail | |
| 8,236,074 B1 | 8/2012 | Bertagnolli et al. | |
| 8,371,756 B2 * | 2/2013 | Waki | F16C 17/03 384/215 |
| 8,545,103 B1 | 10/2013 | Cooley et al. | |
| 8,545,104 B2 | 10/2013 | Cooley et al. | |
| 8,646,981 B2 | 2/2014 | Barrett et al. | |
| 8,651,743 B2 | 2/2014 | Peterson et al. | |
| 8,840,309 B2 | 9/2014 | Cooley et al. | |
| 9,429,188 B2 | 8/2016 | Peterson et al. | |
| 2003/0012468 A1 | 1/2003 | New | |
| 2004/0190804 A1 | 9/2004 | John et al. | |
| 2007/0046119 A1 | 3/2007 | Cooley | |
| 2007/0046120 A1 | 3/2007 | Cooley et al. | |
| 2008/0131039 A1 | 6/2008 | New | |
| 2009/0097788 A1 * | 4/2009 | Cooley | E21B 4/003 384/107 |
| 2009/0194339 A1 * | 8/2009 | Dick | E21B 10/22 175/371 |
| 2009/0268995 A1 | 10/2009 | Ide et al. | |
| 2010/0202880 A1 * | 8/2010 | Blumenthal | F04D 29/057 415/229 |
| 2010/0237621 A1 | 9/2010 | Tessier et al. | |
| 2010/0264134 A1 | 10/2010 | Peterson et al. | |
| 2010/0288558 A1 | 11/2010 | Sexton | |
| 2011/0174544 A1 | 7/2011 | Scott et al. | |
| 2012/0037425 A1 | 2/2012 | Sexton et al. | |
| 2012/0241224 A1 | 9/2012 | Qian et al. | |
| 2012/0261197 A1 | 10/2012 | Miess et al. | |
| 2012/0281938 A1 * | 11/2012 | Peterson | F16C 17/06 384/306 |
| 2013/0182980 A1 | 7/2013 | Barrett et al. | |
| 2013/0192899 A1 | 8/2013 | Cooley et al. | |
| 2013/0343681 A1 | 12/2013 | Cooley et al. | |
| 2014/0102810 A1 | 4/2014 | Peterson et al. | |
| 2014/0105739 A1 | 4/2014 | Peterson et al. | |
| 2014/0355914 A1 | 12/2014 | Cooley et al. | |
| 2015/0144404 A1 | 5/2015 | Peterson et al. | |

(56) References Cited

U.S. PATENT DOCUMENTS

FOREIGN PATENT DOCUMENTS

| KR | 748595 | 8/2007 |
|---|---|---|
| WO | WO 94/01690 | 1/1994 |
| WO | WO 2007/025117 | 3/2007 |

OTHER PUBLICATIONS

U.S. Appl. No. 13/550,831, filed Jul. 17, 2012, Peterson et al.
U.S. Appl. No. 13/550,825, filed Jul. 17, 2012, Perterson et al.
U.S. Appl. No. 13/791,052, filed Mar. 8, 2013, Cooley et al.
U.S. Appl. No. 11/545,929, filed Oct. 10, 2006, Bertagnolli et al.
U.S. Appl. No. 12/425,304, filed Apr. 16, 2009, Peterson et al.
U.S. Appl. No. 12/495,986, filed Jul. 1, 2009, Bertagnolli et al.
U.S. Appl. No. 12/761,535, filed Apr. 16, 2010, Scott et al.
U.S. Appl. No. 13/070,636, filed Mar. 24, 2011, Qian et al.
U.S. Appl. No. 13/087,775, filed Apr. 15, 2011, Miess et al.
U.S. Appl. No. 13/166,007, filed Jun. 22, 2011, Chapman et al.
U.S. Appl. No. 14/012,663, filed Aug. 28, 2013, Cooley et al.
U.S. Appl. No. 14/134,841, filed Dec. 19, 2013, Peterson et al.
U.S. Appl. No. 14/135,064, filed Dec. 19, 2013, Peterson et al.
U.S. Appl. No. 14/464,289, filed Aug. 20, 2014, Cooley et al.
U.S. Appl. No. 14/613,236, filed Feb. 3, 2015, Peterson et al.
U.S. Appl. No. 14/613,260, filed Feb. 3, 2015, Peterson et al.
International Search Report and Written Opinion from International Application No. PCT/US2012/033206 dated Jul. 19, 2012.
International Search Report and Written Opinion from International Application No PCT/US2013/049228 dated Sep. 25, 2013.
International Search Report and Written Opinion from International Application No. PCT/US2013/049208 dated Oct. 8, 2013.
U.S. Appl. No. 13/089,725, Feb. 14, 2013, Notice of Allowance.
U.S. Appl. No. 13/089,725, Mar. 6, 2013, Notice of Allowance.
U.S. Appl. No. 13/089,725, Apr. 5, 2013, Notice of Allowance.
U.S. Appl. No. 13/089,725, May 22, 2013, Notice of Allowance.
U.S. Appl. No. 13/089,725, Jul. 12, 2013, Notice of Allowance.
U.S. Appl. No. 13/089,725, Sep. 11, 2013, Issue Notification.
U.S. Appl. No. 13/550,831, Mar. 25, 2013, Office Action.
U.S. Appl. No. 13/550,831, Jul. 11, 2013, Notice of Allowance.
U.S. Appl. No. 13/550,831, Sep. 26, 2013, Notice of Allowance.
U.S. Appl. No. 13/550,831, Nov. 7, 2013, Notice of Allowance.
U.S. Appl. No. 13/550,831, Jan. 29, 2014, Issue Notification.
U.S. Appl. No. 13/550,825, Jun. 17, 2013, Notice of Allowance.
U.S. Appl. No. 13/550,825, Jul. 19, 2013, Notice of Allowance.
U.S. Appl. No. 13/550,825, Sep. 27, 2013, Notice of Allowance.
U.S. Appl. No. 13/550,825, Dec. 6, 2013, Notice of Allowance.
U.S. Appl. No. 13/550,825, Jan. 22, 2014, Issue Notification.
U.S. Appl. No. 13/791,052, May 29, 2013, Notice of Allowance.
U.S. Appl. No. 13/791,052, Jul. 23, 2013, Notice of Allowance.
U.S. Appl. No. 13/791,052, Sep. 11, 2013, Issue Notification.
U.S. Appl. No. 14/012,663, Oct. 18, 2013, Office Action.
U.S. Appl. No. 14/012,663, Feb. 5, 2014, Office Action.
U.S. Appl. No. 14/012,663, May 27, 2014, Notice of Allowance.
U.S. Appl. No. 14/012,663, Sep. 3, 2014, Issue Notification.
U.S. Appl. No. 14/134,841, Jul. 3, 2014, Office Action.
U.S. Appl. No. 14/134,841, Oct. 29, 2014, Notice of Allowance.
U.S. Appl. No. 14/134,841, Jan. 30, 2015, Notice of Allowance.
U.S. Appl. No. 14/134,841, Feb. 11, 2015, Issue Notification.
U.S. Appl. No. 14/135,064, Jul. 9, 2014, Office Action.
U.S. Appl. No. 14/135,064, Oct. 27, 2014, Notice of Allowance.
U.S. Appl. No. 14/135,064, Feb. 2, 2015, Notice of Allowance.
U.S. Appl. No. 14/135,064, Feb. 11, 2015, Issue Notification.
U.S. Appl. No. 14/613,236, Jun. 5, 2015, Office Action.
U.S. Appl. No. 14/613,236, Sep. 24, 2015, Notice of Allowance.
U.S. Appl. No. 14/613,236, Jan. 20, 2016, Issue Notification.
U.S. Appl. No. 14/613,260, Jan. 5, 2016, Office Action.
U.S. Appl. No. 14/613,260, Apr. 27, 2016, Notice of Allowance.
U.S. Appl. No. 14/613,260, Aug. 10, 2016, Issue Notification.
U.S. Appl. No. 14/464,289, Apr. 7, 2016, Restriction Requirement.
U.S. Appl. No. 14/464,289, Jul. 28, 2016, Office Action.
U.S. Appl. No. 14/464,289, Feb. 23, 2017, Notice of Allowance.
U.S. Appl. No. 14/464,289, Jun. 21, 2017, Issue Notification.

\* cited by examiner

BEARING APPARATUS INCLUDING TILTING PADS

CROSS-REFERENCE TO RELATED APPLICATIONS

This application is a continuation of U.S. application Ser. No. 14/464,289 filed on 20 Aug. 2014 (now U.S. Pat. No. 9,702,400 issued on 11 Jul. 2017), which is a continuation of U.S. application Ser. No. 14/012,663 filed 28 Aug. 2013 (now U.S. Pat. No. 8,840,309 issued on 23 Sep. 2014), which is a continuation of U.S. application Ser. No. 13/791,052 filed on 8 Mar. 2013 (now U.S. Pat. No. 8,545,104 issued on 1 Oct. 2013), which is a continuation of U.S. application Ser. No. 13/089,725 filed on 19 Apr. 2011 (now U.S. Pat. No. 8,545,103 issued on 1 Oct. 2013), the disclosure of each of the foregoing applications is incorporated herein, in its entirety, by this reference.

BACKGROUND

Wear-resistant, superhard compacts are utilized in a variety of mechanical applications. For example, polycrystalline diamond compacts ("PDCs") are used in drilling tools (e.g., cutting elements, gage trimmers, etc.), machining equipment, bearing apparatuses, wire-drawing machinery, and in other mechanical apparatuses.

PDCs have found particular utility as superhard bearing elements in fixed-position thrust bearings within subterranean drilling systems. A PDC bearing element typically includes a superhard diamond layer commonly referred to as a diamond table. The diamond table is formed and bonded to a substrate using a high-pressure/high-temperature ("HPHT") process.

A fixed-position thrust-bearing apparatus includes a number of PDC bearing elements affixed to a support ring. The PDC bearing elements bear against PDC bearing elements of an adjacent bearing assembly during use. PDC bearing elements are typically brazed directly into a preformed recess formed in a support ring of a fixed-position thrust bearing.

SUMMARY

Embodiments of the invention relate to bearing assemblies and apparatuses, which may be operated hydrodynamically. The disclosed bearing assemblies and apparatuses may be employed in bearing apparatuses for use in downhole motors of a subterranean drilling system or other mechanical systems.

In one or more embodiments, a bearing assembly includes a support ring and a plurality of tilting pads. Each tilting pad is tilted and/or tiltably secured relative to the support ring. In some embodiments, one or more of the tilting pads include a plurality of superhard bearing segments assembled to form a superhard bearing surface. One or more seams may be formed and positioned between adjacent superhard bearing segments of the superhard bearing segments. In other embodiments, one or more of the tilting pads may include at least one or only one superhard bearing segment, such as a polycrystalline diamond ("PCD") bearing segment.

In an embodiment, a bearing apparatus includes a rotor and a stator. The rotor or stator may include any of the bearing assembly embodiments disclosed herein.

Other embodiments are directed to motor assemblies including any of the bearing assembly and apparatus embodiments disclosed herein.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the present disclosure, wherein identical reference numerals refer to identical or similar elements or features in different views or embodiments shown in the drawings.

DETAILED DESCRIPTION

Embodiments of the invention relate to tilting pad bearing assemblies and apparatuses, which may be operated hydrodynamically. The disclosed tilting pad bearing assemblies and apparatuses may be employed in downhole motors of a subterranean drilling system or other mechanical systems. Motor assemblies including at least one of such bearing assemblies or apparatus are also disclosed, as well as methods of fabricating such bearing assemblies and apparatuses utilizing superhard compacts.

While the description herein provides examples relative to a subterranean drilling and motor assembly, the tilting pad bearing assembly and apparatus embodiments disclosed herein may be used in any number of applications. For instance, tilting pad bearing assemblies and apparatuses may be used in pumps, motors, compressors, turbines, generators, gearboxes, and other systems and apparatuses, or in any combination of the foregoing. Furthermore, while the embodiments disclosed herein are described as being operated hydrodynamically, the tilting pad bearing assemblies and apparatuses may also be operated partially hydrodynamically or not hydrodynamically, if desired or needed.

Figure 1A:
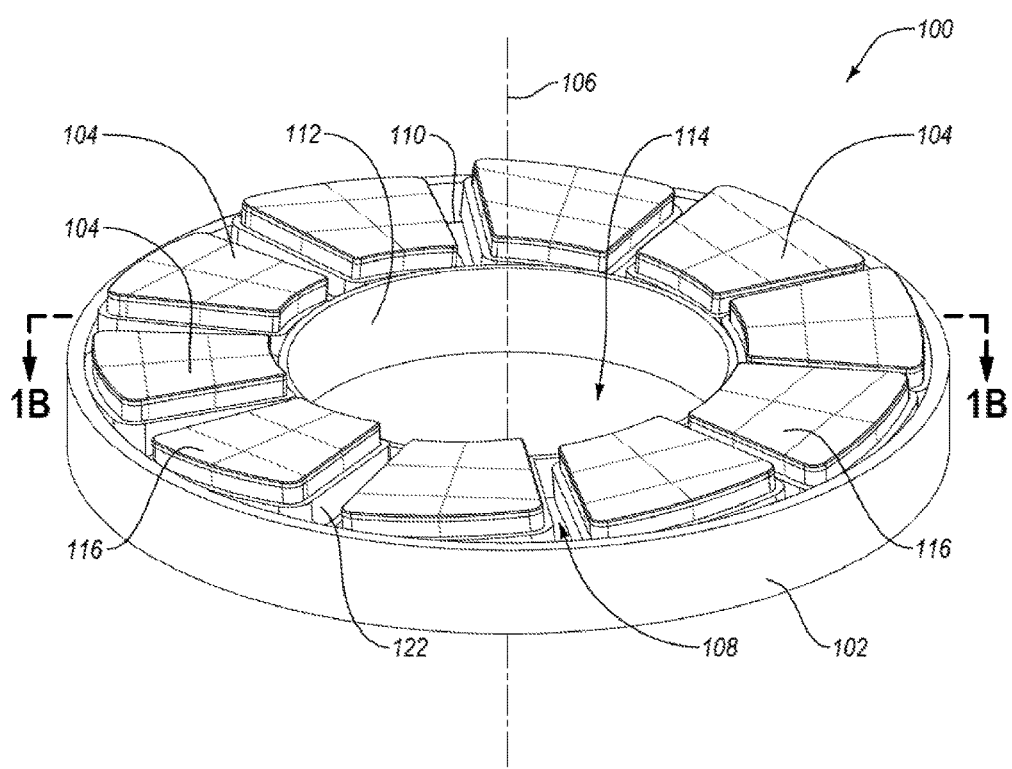
FIG. 1A is an isometric view of a hydrodynamic tilting pad thrust-bearing assembly according to an embodiment.
Figure 1B:
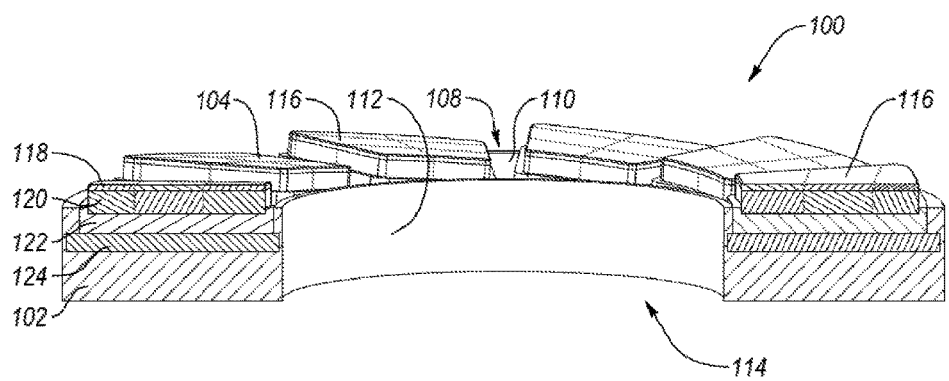
FIG. 1B is an isometric partial cross-sectional view taken along line 1B-1B of the hydrodynamic tilting pad thrust-bearing assembly shown in FIG. 1A.

FIGS. 1A and 1B are isometric and isometric partial cross-sectional views, respectively, of a hydrodynamic tilting pad thrust-bearing assembly 100 according to an embodiment. The bearing assembly 100 includes a support ring 102 that carries a plurality of circumferentially spaced tilting pads 104. The tilting pads 104 may include, for instance, fixed tilting pads, adjustable tilting pads, self-establishing tilting pads, other bearing pads or elements, or combinations of the foregoing.

The tilting pads 104 of the illustrated embodiment generally have a truncated pie-shaped geometry or a generally trapezoidal geometry, and may be distributed about a thrust axis 106, along which a thrust force may be generally directed during use. Each tilting pad 104 may be located circumferentially adjacent to another tilting pad 104, with a gap 108 or other offset therebetween. For instance, the gap 108 may separate adjacent tilting pads 104 by a distance of about 2.0 mm to about 20.0 mm, or more particularly a distance of about 3.5 mm to about 15 mm, although the separation distance may be greater or smaller. For instance, as the size of the hydrodynamic tilting pad bearing assembly 100 increases, the size of the tilting pads 104 and/or the size of the gaps 108 may also increase. Each tilting pad 104 includes a discrete superhard bearing surface 116, such that the tilting pads 104 collectively provide a non-continuous superhard bearing surface. The term "superhard," as used herein, means a material having a hardness at least equal to a hardness of tungsten carbide.

To support the tilting pads 104 of the bearing assembly 100, the support ring 102 may define a channel 110 and the tilting pads 104 may be placed within the channel 110. In other embodiments, the support ring 102 may define multiple pockets or otherwise define locations for the tilting pads 104. The tilting pads 104 may then be supported or secured within the support ring 102 in any suitable manner. For instance, as discussed hereafter, a pivotal connection may be used to secure the tilting pads 104 within the support ring 102, although any other suitable securement or attachment mechanism may also be utilized. The support ring 102 may also include an inner, peripheral surface defining an aperture 114. The aperture 114 may be generally centered about the thrust axis 106, and may be adapted to receive a shaft (e.g., a downhole motor shaft).

As best shown in FIG. 1B, each tilting pad 104 may include a plurality of superhard bearing segments having a plurality of materials, layers, segments, or other elements, or any combination of the foregoing. For instance, as discussed in greater detail herein, the tilting pads 104 may be composed of multiple superhard bearing segments. In such an embodiment, multiple individual segments may be arranged relative to each other to collectively define a hydrodynamic superhard bearing surface 116 for each tilting pad 104.

Each tilting pad 104 optionally includes multiple layers or other components. For instance, each segment of the tilting pad 104 may be a superhard compact that includes a superhard table 118 bonded to a substrate 120. The superhard table 118 may be at least partially made from a number of different superhard materials. Suitable materials for use in the superhard table 118 include natural diamond, sintered PCD, polycrystalline cubic boron nitride, diamond grains bonded together with silicon carbide, or combinations of the foregoing. In an embodiment, the superhard table 118 is a PCD table that includes a plurality of directly bonded-together diamond grains exhibiting diamond-to-diamond bonding therebetween (e.g., $sp^3$ bonding), which define a plurality of interstitial regions. A portion of, or substantially all of, the interstitial regions of such a superhard table 118 may include a metal-solvent catalyst or a metallic infiltrant disposed therein that is infiltrated from the substrate 120 or from another source. For example, the metal-solvent catalyst or metallic infiltrant may be selected from iron, nickel, cobalt, and alloys of the foregoing. The superhard table 118 may further include thermally-stable diamond in which the metal-solvent catalyst or metallic infiltrant has been partially or substantially completely depleted from a selected surface or volume of the superhard table 118 using, for example, an acid leaching process.

For example, appropriately configured PDCs may be used as the tilting pads 104, which may be formed in an HPHT processes. For example, diamond particles may be disposed adjacent to the substrate 120, and subjected to an HPHT process to sinter the diamond particles to form a PCD table that bonds to the substrate thereby forming the PDC. The temperature of the HPHT process may be at least about 1000° C. (e.g., about 1200° C. to about 1600° C.) and the cell pressure of the HPHT process may be at least 4.0 GPa (e.g., about 5.0 GPa to about 12 GPa or about 7.5 GPa to about 11 GPa) for a time sufficient to sinter the diamond particles.

The diamond particles may exhibit an average particle size of about 50 μm or less, such as about 30 μm or less, about 20 μm or less, about 10 μm to about 18 μm, or about 15 μm to about 18 μm. In some embodiments, the average particle size of the diamond particles may be about 10 μm or less, such as about 2 μm to about 5 μm or submicron. In some embodiments, the diamond particles may comprise a relatively larger size and at least one relatively smaller size. As used herein, the phrases "relatively larger" and "relatively smaller" refer to particle sizes (by any suitable method) that differ by at least a factor of two (e.g., 30 μm and 15 μm). According to various embodiments, the mass of diamond particles may include a portion exhibiting a relatively larger size (e.g., 30 μm, 20 μm, 15 μm, 12 μm, 10 μm, 8 μm) and another portion exhibiting at least one relatively smaller size (e.g., 6 μm, 5 μm, 4 μm, 3 μm, 2 μm, 1 μm, 0.5 μm, less than 0.5 μm, 0.1 μm, less than 0.1 μm). In one embodiment, the diamond particles may include a portion exhibiting a relatively larger size between about 10 μm and about 40 μm and another portion exhibiting a relatively smaller size between about 1 μm and 4 μm. In some embodiments, the diamond particles may comprise three or more different sizes (e.g., one relatively larger size and two or more relatively smaller sizes), without limitation. The PCD table so-formed after sintering may exhibit an average diamond grain size that is the same or similar to any of the foregoing diamond particle sizes and distributions.

In some embodiments, one or more $sp^2$-carbon-containing additives may be mixed with the diamond particles. For example, the one or more $sp^2$-carbon-containing additives may be present in a mixture with the diamond particles in an amount of about 1 weight percent ("wt %") to about 15 wt %, such as 3 wt % to about 12 wt %, about 4.5 wt % to about 6.5 wt %, about 4.5 wt % to about 5.5 wt, or about 5 wt % of the mixture. The one or more $sp^2$-carbon-containing additives may be chosen from graphite, graphene, fullerenes, ultra-dispersed diamond particles, or combinations of the foregoing.

In an embodiment, the superhard table 118 may be integrally formed with the substrate 120. For example, the superhard table 118 may be a sintered PCD table that is integrally formed with the substrate 120. In such an embodiment, the infiltrated metal-solvent catalyst may be used to catalyze formation of diamond-to-diamond bonding between diamond grains of the superhard table 118 from diamond powder during HPHT processing. In another embodiment, the superhard table 118 may be a pre-sintered superhard table that has been HPHT bonded to the substrate 120 in a second HPHT process after being initially formed in a first HPHT process. For example, the superhard table 118 may be a pre-sintered PCD table that has been leached to substantially completely remove metal-solvent catalyst used in the manufacture thereof and subsequently HPHT bonded or brazed to the substrate 120 in a separate process.

In some embodiments, the superhard table 118 may be leached to deplete a metal-solvent catalyst or a metallic infiltrant therefrom in order to enhance the thermal stability of the superhard table 118. For example, where the superhard table 118 is a PCD table, the superhard table 118 may be leached to remove at least a portion of the metal-solvent catalyst from a working region thereof to a selected depth that was used to initially sinter the diamond grains to form a leached thermally-stable region. The leached thermally-stable region may extend inwardly from the superhard bearing surface 116 to a selected depth. In one example, the depth of the thermally-stable region may be about 10 μm to about 500 μm. More specifically, in some embodiments, the selected depth is about 50 μm to about 100 μm or about 200 μm to about 350 μm. The leaching may be performed in a suitable acid, such as aqua regia, nitric acid, hydrofluoric acid, or mixtures of the foregoing.

The substrate 120 may similarly be formed from any number of different materials, and may be integrally formed with, or otherwise bonded or connected to, the superhard table 118. Materials suitable for the substrate 120 may include, without limitation, cemented carbides, such as tungsten carbide, titanium carbide, chromium carbide, niobium carbide, tantalum carbide, vanadium carbide, or combinations thereof cemented with iron, nickel, cobalt, or alloys thereof. For example, in an embodiment, the substrate 120 comprises cobalt-cemented tungsten carbide. However, in certain embodiments, the superhard tables 118 may be omitted, and each superhard bearing segment may be made from a superhard material, such as cemented tungsten carbide. In other embodiments, the substrate 120 may be omitted and the superhard bearing segment may be a superhard material, such as a polycrystalline diamond body that has been leached to deplete metal-solvent catalyst therefrom or may be an un-leached PCD body.

In the embodiment illustrated in FIGS. 1A and 1B, the superhard tables 118 of mating superhard bearing segments may collectively define a substantially continuous superhard bearing surface 116 of a respective tilting pad 104. More particularly, the tilting pads 104 may be used in connection with a runner or other superhard bearing element. In general, the hydrodynamic tilting pad bearing assembly 100 may rotate relative to a runner or other superhard bearing element while a lubricant or other fluid floods the hydrodynamic tilting pad bearing assembly 100 and the runner. As the bearing assembly 100 is rotated relative to a runner, a fluid film separating the runner from the superhard bearing surfaces 116 may develop. For favorable use of the hydrodynamic forces within the lubricant, the tilting pads 104 may tilt which may result in a higher lubricant film thickness existing at a leading edge (i.e., an edge of a tilting pad 104 that would be traversed first by any line on the runner while the assembly 100 moves in the direction of rotation of the assembly 100), than at a trailing edge (i.e., an edge of a tilting pad 104 over which a line of the superhard bearing element is second to pass in the direction of rotation of the assembly 100), at which a minimum film thickness may develop.

In the illustrated embodiment, the set of superhard bearing segments collectively defining at least a portion of the tilting pad 104 are secured to a support plate 122. The support plate 122 may, for instance, be formed of a metal, an alloy, a cemented carbide material, other material, or any combination thereof. The substrate 120 of the superhard bearing segments may be secured to the support plate 122 by brazing, welding, or other method. In some embodiments, the support plate 122 may define a pocket into which the superhard bearing segments may be assembled and/or positioned. In at least one embodiment, the support plate 122 has an integral construction such that a single segment may form substantially the full support plate 122, while multiple superhard bearing segments may be used to form the superhard bearing surface 116. In other embodiments, multiple segments of one or more materials may be used to form or define the support plate 122.

The degree to which the tilting pads 104 rotate or tilt may be varied in any suitable manner. For instance, in an embodiment, the tilting pads 104 may be tilted about respective radial axes that extend radially from the thrust axis 106 and through each respective tilting pad 104. In FIG. 1B, the support plate 122 may be attached to a pin 124. The pin 124 may be allowed to at least partially rotate, or may otherwise define or correspond to a tilt axis 125. For instance, in accordance with some embodiments, the pin 124 is journaled or otherwise secured within the support ring 102 in a manner that allows the pin 124 to rotate relative to the support ring 102. The pin 124 may be fixed to the support plate 122 such that as the pin 124 rotates relative to the support ring 102, the support plate 122 may also rotate or tilt relative to the axis 125 of the pin 124. The pin 124 and support plate 122 may rotate or tilt between zero and twenty degrees in some embodiments, such that the superhard bearing surfaces 116 of the respective tilting pads 104 may also tilt between about zero and about twenty degrees relative to the pin 124 or other horizontal axis. In other embodiments, the pin 124 and/or the superhard bearing surface 116 may rotate between about zero and about fifteen degrees, such as a positive or negative angle (θ) of about 0.5 to about 3 degrees (e.g., about 0.5 to about 1 degree or less than 1 degree) relative to the axis 125 of the pin 124. In some cases, the support ring 102 may be configured for bidirectional rotation. In such a case, the pin 124 may be allowed to rotate in clockwise and counter-clockwise directions. In such an embodiment, the superhard bearing surface 116 may thus tilt in either direction relative to the axis of the pin 124 and/or the support ring 102. For instance, the superhard bearing surface 116 may be rotated to a position anywhere between a positive or negative angle of about twenty degrees relative to an axis of the pin 124, such as a positive or negative angle (θ) of about 0.5 to about 3 degrees (e.g., about 0.5 to about 1 degree or less than 1 degree) relative to the axis 125 of the pin 124.

The pin 124 may be used to allow the tilting pads 104 to selectively rotate. For instance, the tilting pads 104 may be self-establishing such that based on the lubricant used, the axial forces applied along the thrust axis, the rotational speed of the runner or hydrodynamic tilting pad bearing assembly 100, other factors, or combinations of the foregoing, the tilting pads 104 may automatically or otherwise adjust to a desired tilt or other orientation. In still other embodiments, the tilting pads 104 may be fixed at a particular tilt, or may be manually set to a particular tilt with or without being self-establishing.

Further, the pin 124 represents a single mechanism for facilitating rotation, translation, or other positioning of the tilting pads 104 so as to provide tilting pad superhard bearing surfaces 116. In other embodiments, other mechanisms may be used. By way of illustration, leveling links, pivotal rockers, spherical pivots, other elements, or any combination of the foregoing may also be used to facilitate positioning of the tilting pads 104 in a tilted configuration. In an embodiment, the support plate 122 may be used to facilitate rotation of a respective tilting pad 104. The support plate 122 may, for instance, be machined or otherwise formed to include a receptacle, an opening, or other structure into which the pin 124 may be at least partially received or secured. In embodiments in which the pin 124 is excluded, the support plate 122 may be machined or otherwise formed to include other components, such as spherical pivot, pivotal rocker, or leveling link interface. The support plate 122 may be formed of any suitable material, such as steel or other alloy; however, in some embodiments the support plate 122 is formed of a material that is relatively softer than the substrate 120, such that the support plate 122 may be relatively easily machined or formed into a desired shape or form. In other embodiments, the support plate 122 can be eliminated and the substrate 120 may be directly machined or formed to facilitate tilting of the tilting pad 104.

In some embodiments, the tilt axis of the tilting pads 104 is centered relative to the tilting pads 104. For instance, where the support ring 102 may be configured for bi-directional rotation, the tilt axis of the tilting pads 104 may be centered due to either of opposing edges of the tilting pads 104 being the leading or trailing edge, based on a particular direction of rotation. In other embodiments, the tilt axis of a tilting pad 104 may be offset relative to a center of the tilting pads 104. For instance, where the support ring 102 is part of a rotor configured for only unidirectional rotation, the axis of rotation of the tilting pad 104 may be offset such that the axis of rotation is closer to one of the leading edge or the trailing edge of the tilting pad 104. In other embodiments, a tilt axis may be offset from center despite a rotor being configured for bidirectional rotation, or a tilt axis may be centered despite a rotor being configured for unidirectional rotation.

The use of superhard materials such as those contemplated in the present disclosure may provide wear resistance, frictional, or other properties that extend the useful life and/or utility of the corresponding bearing, motor, or other assemblies described herein. For instance, in some applications, hardened steel bearing tilting pads may wear at a rate that is between five and twenty times greater than bearing pads made of superhard materials. Thus, in at least some applications, use of superhard materials in a tilting pad bearing assembly may significantly increase the potential useful life of a bearing assembly.

While superhard materials may thus provide desirable wear characteristics, use of some superhard materials may be limited in various regards. For instance, certain types of superhard materials may be manufacturable in limited quantities, or may be available with certain size restrictions. Such limitations may be the result of technological, quality, or economic constraints. For instance, in some cases, the technology to produce large pieces of a superhard material may not exist, or developing machinery that may produce large pieces may be cost prohibitive, or result in low quality components. PDCs are a superhard article including at least one such material that is considered to have production size constraints. For instance, as described herein, PDCs may be produced using an HPHT sintering and/or bonding process. To maintain the temperature and pressure requirements over a large surface area, and thereby produce large segments of PDCs, can consume large amounts of power and require large, powerful, and sophisticated machinery. If such pressure and temperature tolerances are not maintained, the PDCs may include defects that reduce desirable wear resistance and/or frictional characteristics of the PDCs. Moreover, the temperature and/or pressure requirements for production of a high quality and large PDC may exceed the capabilities of currently available HPHT presses. Consequently, PDCs are currently produced under size restrictions. For example, PDCs are available in limited sizes that typically range up to about 25 mm to about 75 mm (e.g., about 25 mm to about 30 mm) in diameter for cylindrical PDCs and up to about 3.0 mm in diamond table thickness.

Where the hydrodynamic tilting pad bearing assembly of FIGS. 1A and 1B, includes superhard bearing segments formed from PDCs or other polycrystalline diamond material, use of a unitary PDC for an entire molding element may currently be available primarily where the tilting pad 104 is very small (e.g., having size dimensions limited to a maximum dimension of about 25 mm to about 30 mm). Tilting pad bearing assemblies, however, often require or use tilting pads that far exceed the size of a typical PDC. For instance, in a turbine application, it may not be uncommon for tilting pad bearing assemblies to utilize tilting pads having length and/or width dimensions measuring 30 mm or more. For instance, tilting pads may be used in bearing systems where tilting pads measure between about 30 mm and about 1500 mm. More particularly, in some embodiments, a length and/or width of a tilting pad may measure between about 50 mm and about 1000 mm, although larger or smaller tilting pads may be utilized. Because of the significant wear resistive properties that PDCs or other superhard materials provide, it is nonetheless desirable to use superhard materials for large tilting pads or other superhard bearing segments, even when the tilting pads exceed the size of available superhard materials.

Figure 1C:
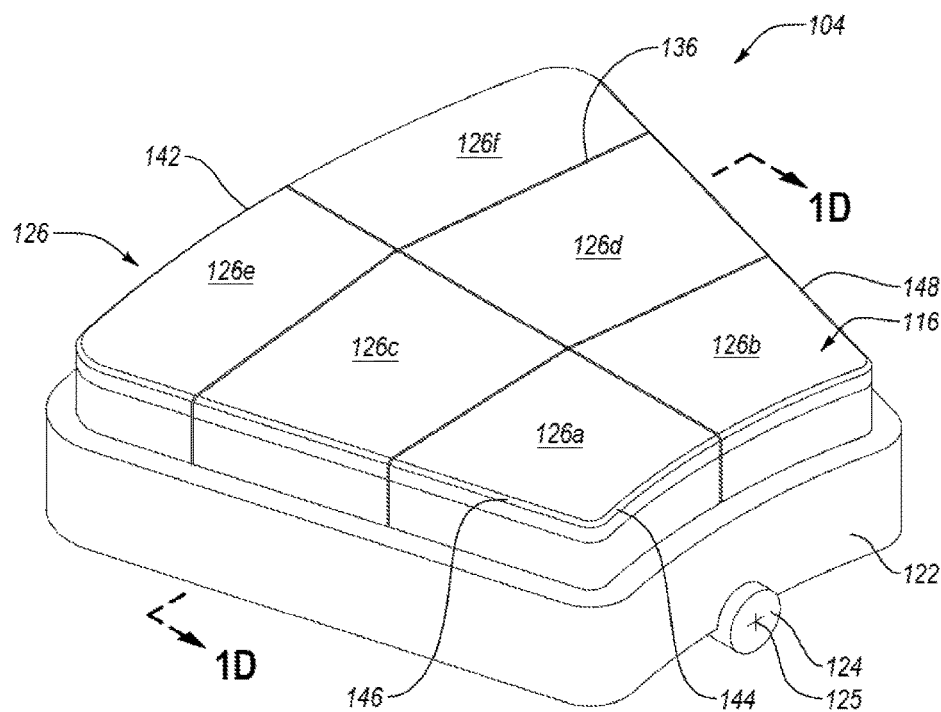
FIG. 1C is an isometric view of one of the tilting pads shown in FIGS. 1A and 1B, the tilting pad being segmented into multiple segments having substantially planar adjoining ends according to an embodiment.
Figure 1D:
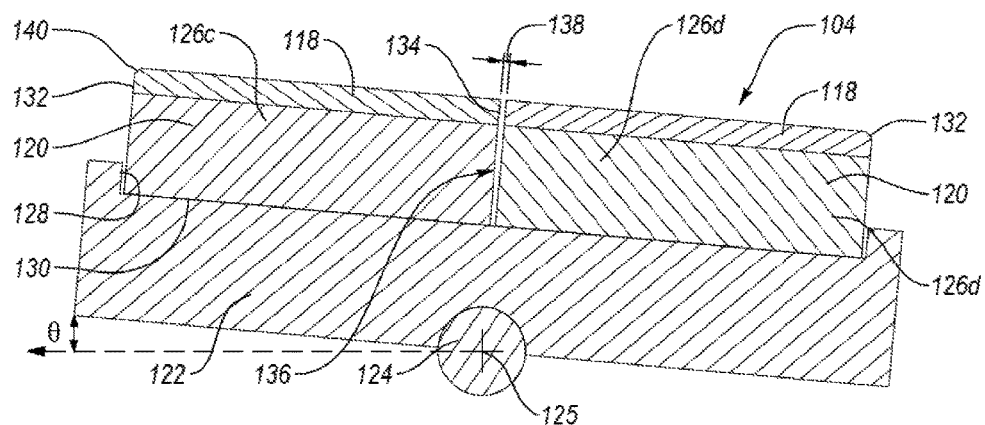
FIG. 1D is a cross-sectional view taken along line 1D-1D of the bearing tilting pad shown in FIG. 1C.

According to some embodiments, superhard materials such as polycrystalline diamond or PDCs including polycrystalline diamond may be formed as multiple independent superhard bearing segments that may be joined and/or assembled together to collectively define a superhard bearing element and/or superhard bearing surface. FIGS. 1C and 1D illustrate in greater detail such an embodiment in which multiple segments are combined to define a superhard bearing element in the form of a tilting pad.

In particular, FIGS. 1C and 1D are isometric and cross-sectional views, respectively, of a single tilting pad 104 that may be used in connection with the hydrodynamic tilting pad bearing assembly described above. The tilting pad 104 includes multiple superhard bearing segments 126a-f that collectively define the bearing pad 126, including a substantially continuous superhard bearing surface 116. Each superhard bearing segment 126a-f may include a superhard table 118 bonded to a substrate 120, and each segment 126a-f may further be secured within the support plate 122 by brazing, press-fitting, fastening with fasteners, or other suitable attachment mechanism. In the illustrated embodiment, the support plate 122 may facilitate attachment of the segments 126a-f to the support plate 122 by including an interior surface 128 that defines an interior pocket 130. The pocket 130 may be sized to generally correspond to a size of the collective, assembled set of segments 126a-f. The superhard bearing segments 126a-f may be assembled within the pocket 130 and secured to the support plate 122 by brazing the segments 126a-f to the support plate 122, press-fitting the segments 126a-f to the support plate 122 and/or against each other, attaching each of the superhard bearing segments 126a-f to the support plate 122 using a mechanical fastener, or using another suitable technique, or any combination of the foregoing. It is noted that the support plate 122 merely represents one embodiment for a support plate and other configurations may be used. For example, according to another embodiment, a support plate may lack a pocket or other receptacle. In still another embodiment, the support plate may be eliminated. For instance, the segments 126a-f may be directly connected together and the substrates 120 may directly engage the support ring 102 (FIGS. 1A and 1B) and/or a tilt mechanism.

The illustrated embodiment shows an example structure of the superhard bearing segments 126a-f, and an example of how the superhard bearing segments 126a-f may be assembled together. In this embodiment, six superhard bearing segments 126a-f collectively define a pie-shaped bearing pad 126 and a substantially continuous superhard bearing surface 116, although more or fewer than six segments may be provided. Generally, more than one bearing segment may be provided to collectively form a tilting pad. Each superhard bearing segment 126a-f may include at least one outer edge region 132 and at least one interior edge region 134. In the illustrated embodiment, each outer edge region 132 defines a portion of a periphery of the superhard bearing surface 116. Each interior edge region 134 may be configured to correspond with, and in some embodiments may mesh with, corresponding interior edge regions of one or more of other of the superhard bearing segments 126a-f. In FIG. 1C, for instance, each of the superhard bearing segments 126a-f is configured to be arranged such that the interior edge region 134 mates with corresponding interior edge regions of at least two and sometimes three adjacent segments 126a-f.

In the illustrated embodiment, the superhard bearing surface 116 is substantially planar, although such embodiment is merely illustrative. In other embodiments, the superhard bearing surface 116 may be curved, or have another contour or topography. Moreover, the outer edges of the superhard bearing surface 116 optionally include a chamfer 140. The chamfer 140 may be formed by placing a chamfer on the individual outer edge regions 132 of each of the superhard bearing segments 126a-f. The superhard bearing surface 116 may also take a number of other forms. For instance, in FIG. 1C, the superhard bearing surface 116 is substantially pie shaped with a curved and chamfered outer edge 142 and curved and chamfered interior edge 144. Chamfered side edges 146, 148 may be substantially straight and taper inward from the outer edge 142 to the interior edge 144. In other embodiments, the edges of a superhard bearing surface 116 may define other shapes, including radiused, arcuate, circular, elliptical, trapezoidal, or other shaped surfaces, or may form a sharp edge.

The superhard bearing segments 126a-f may also be arranged to each have any desired individual shape. By way of illustration, a set of seams 136 may be at least partially formed between separate superhard bearing segments 126a-f and each superhard bearing segment 126a-f may have a different size and/or shape. The superhard bearing segments 126a-f and/or seams 136 may be non-symmetrical. In other embodiments, however, the seams 136 and/or the superhard bearing segments 126a-f may define the superhard bearing surface 116 in a substantially symmetrical fashion.

Any number of superhard bearing segments may be used to form a superhard bearing surface 116. For instance, as noted above, a bearing tilting pad may be sized many times larger than a largest available size of a PDC or other material used to form a portion of the bearing tilting pad, or may be small enough to be formed of a single PDC. In FIG. 1C, six superhard bearing segments 126a-f may be used to define the full size of the superhard bearing surface 116. In other embodiments, however, more or less than six superhard bearing segments may be used. By way of illustration, a bearing tilting pad measuring 75 mm in circumferential width and 100 mm in radial length, may include ten or more individual segments. In some embodiments, some individual segments include only interior edges of the corresponding superhard bearing surface, such as where a segment is bounded in all directions by other of the superhard bearing segments. Thus, it is not necessary that a superhard bearing segment have a portion thereof corresponding to an outer edge of the superhard bearing surface 116.

The interior edge regions 134 of the superhard bearing segments 126a-f may be configured to limit fluid from being able to leak through the seams 136 formed between adjacent superhard bearing segments 126a-f. By way of illustration, the seams 136 may be interconnected and defined by interfaces between the interior edge regions 134. Depending upon the tolerances of the superhard bearing segments 126a-f, all or a portion of the seams 136 may comprise a relatively small gap 138. For example, the gap 138 may have a width of about 0.001 mm to about 3.5 mm, more particularly a width of about 0.0025 mm to about 2.5 mm, and more particularly a width of about 0.125 mm to about 1.25 mm. More particularly still, the gap 138 may have a width from about 0.025 mm up to about 1.0 mm. In another embodiment, the gap 138 may have a width from about 0.005 mm up to about 0.50 mm. As the gaps 138 decrease in size, it may become more difficult for fluid to flow radially between the gaps 138 and leak from the superhard bearing surface 116 of the superhard bearing element 104. However, it should be noted that in at least some operational conditions, entrained fluid in the gaps 138 may assist with formation of a hydrodynamic film on the superhard bearing surface 116.

Figure 2A:
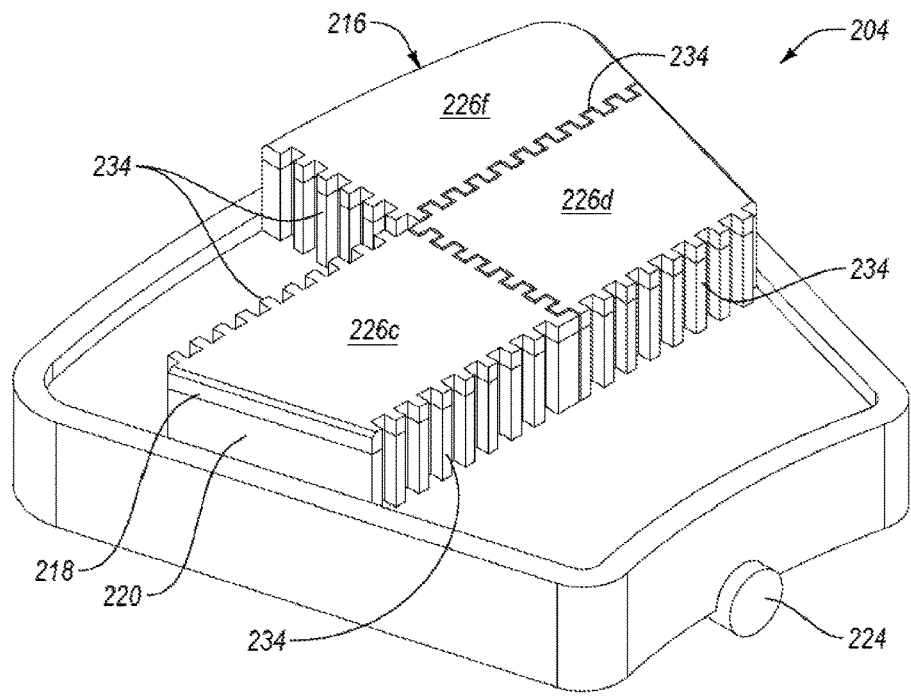
FIG. 2A is an isometric view of three adjacent superhard bearing segments of a tilting pad, the superhard bearing segments having slotted ends forming a set of seams between the three superhard bearing segments according to an embodiment.
Figure 2B:
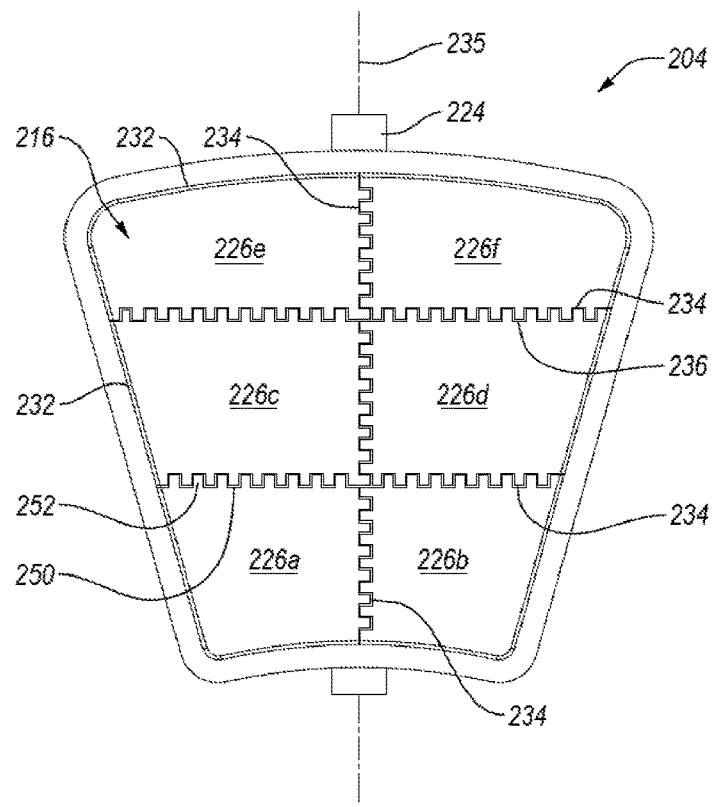
FIG. 2B is a top plan view of the tilting pad of FIG. 2A, the tilting pad being fully assembled and including six superhard bearing segments defining seams therebetween.

The interior edge regions 134 of the superhard bearing segments 126a-f in FIGS. 1C and 1D may be substantially straight or planar and may create substantially planar seams 136 between the various segments 126a-f. In other embodiments, one or more segments may exhibit other configurations or geometry that depart from the illustrated embodiment in FIGS. 1A-1D. For example, FIGS. 2A and 2B illustrate isometric and top plan views, respectively, of a tilting pad 204 according to another embodiment. The tilting pad 204 includes multiple superhard bearing segments 226a-f, each of which may include a superhard table 218 bonded to a substrate 220. The substrate 220 and/or superhard table 218 may further be bonded to a support plate 222 using a brazing, fastening, or other process such as those described herein. The tilting pad 204 may also be configured to pivot or otherwise tilt. For instance, a pin 224 may be attached to the support plate 222. The pin 224 may have a central axis 235 about which it tilts, thereby allowing the superhard bearing surface 216 to also pivot, rotate, tilt, or otherwise move about the central axis 235.

The superhard bearing segments 226a-f of the illustrated embodiment each include interior edge regions 234 configured to correspond to and/or mate with interior edge regions 234 of two or three adjacent superhard bearing segments 226a-f. Each of the superhard bearing segments 226a-f may further include an outer edge region 232 defining at least a portion of the periphery of the superhard bearing surface 216. As discussed herein, the foregoing is merely an example. In other embodiments, there may be one or more superhard bearing segments that do not include an outer edge region, include an interior edge region corresponding to, or mating with, only one or more than three adjacent superhard bearing segments, or superhard bearing segments may have still other configurations.

In the illustrated embodiment, the superhard bearing segments 226a-f may include, at their respective interior edge regions 234, generally rectangular-shaped slots 250 and rectangular-shaped ridges 252. The slots 250 and ridges 252 may be configured to correspond to and potentially mesh with corresponding ridges 252 and slots 250 of adjoining segments 226a-f. Consequently, the superhard bearing segments 226a-f may at least partially interlock along respective interior edge regions 234.

Each superhard bearing segment 226a-f may thus be positioned radially, circumferentially, or otherwise adjacent to another of the superhard bearing segments 226a-f, with one of the seams 236 formed therebetween. In some embodiments, interlocked superhard bearing segments 226a-f may act to limit fluid leakage at the superhard bearing surface 216. For instance, the seams 236 may define a tortuous path to limit fluid leakage through the seams 236. If present, gaps located between adjacent superhard bearing segments 226a-f may further be filled with a sealant material to help limit leakage of fluid through the seams 236. For example, gaps between interior edge regions 234 may be substantially filled with a sealant material. Examples of sealant materials may include a ceramic material, metallic material, polymeric material, or another suitable material, or any combination of the foregoing. In an embodiment, the sealant material may exhibit abrasion and/or erosion resistance to commonly used drilling fluids (also known as drilling mud). For example, a sealant material may comprise chemically-vapor-deposited ("CVD") diamond or a CVD-deposited carbide material (e.g., binderless tungsten carbide). Specifically, one example of a commercially available CVD binderless tungsten carbide material (currently marketed under the trademark HARDIDE®) is currently available from Hardide Layers Inc. of Houston, Tex.

In other embodiments, a binderless tungsten carbide material may be formed by physical vapor deposition ("PVD"), variants of PVD, high-velocity oxygen fuel ("HVOF") thermal spray processes, supersonic transfer ("SST"), or any other suitable process, without limitation. In still other embodiments, the braze alloy used to braze the superhard bearing segments 226a-f to the support plate 222 may infiltrate the seams 236 and substantially fill all or a portion of the gaps at the seams 236, which may exist at the interfaces of the interior edge regions 234 of mating superhard bearing segments 226a-f. For example, suitable abrasion resistant braze alloys include, but are not limited to, silver-copper based braze alloys commercially known as braze 505 and braze 516 and are available from Handy & Harmon of Canada Limited. In another embodiment, a sealant material may comprise a hardfacing material (e.g., a nickel or cobalt alloy) applied at least within the gaps by thermal spraying. In yet a further embodiment, a sealant material may comprise polyurethane, or another suitable polymeric, metal, alloy, or other material. In another embodiment, a substantially continuous superhard bearing surface 216 may be at least partially formed by depositing a layer of diamond onto the surface 216 and into gaps between the segments 226a-f.

Figure 3:
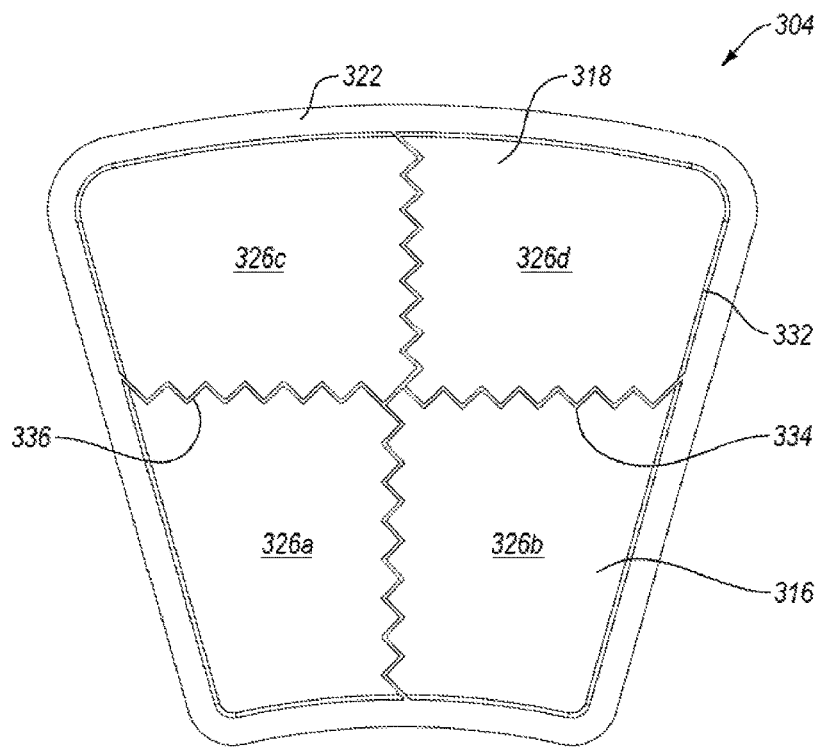
FIG. 3 is a top plan view of a tilting pad comprising multiple segments having serrated ends that form seams between the multiple segments according to another embodiment.
Figure 4:
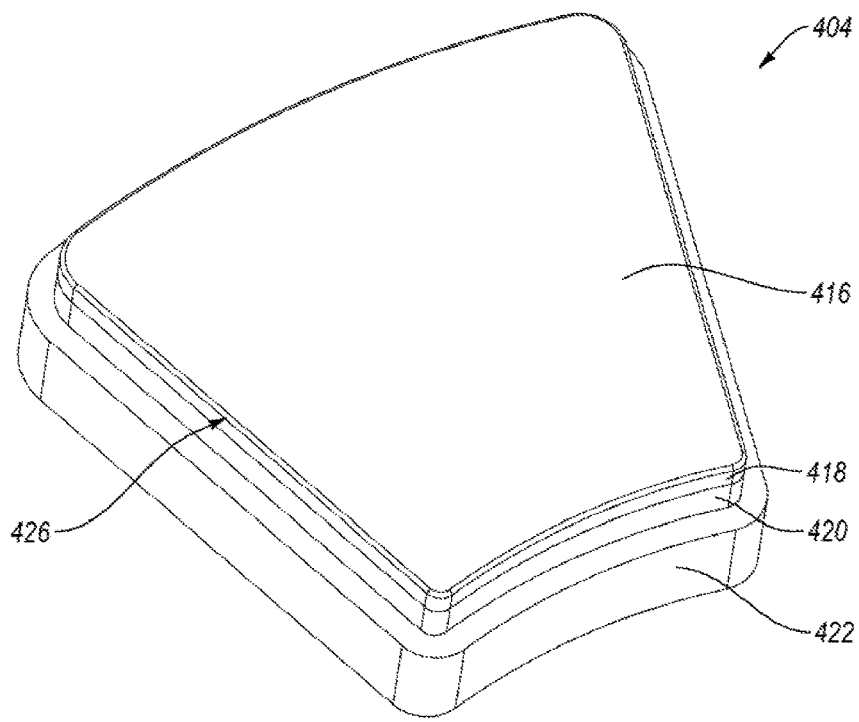
FIG. 4 is an isometric view of a tilting pad comprising a unitary superhard bearing element according to another embodiment.

FIGS. 3 and 4 illustrate top plan and isometric views, respectively, of different embodiments of tilting pads that may be employed in a hydrodynamic tilting pad bearing assembly according to an embodiment. In particular, FIG. 3 illustrates a tilting pad 304 that may include a plurality of superhard bearing segments 326a-d, each of which includes a superhard table 318 with a superhard bearing surface 316 bonded to a substrate (not shown). The superhard table 318 and substrate (not shown) is optionally bonded or otherwise connected to a support plate 322.

The superhard bearing segments 326a-d each may include an outer edge region 332 and an interior edge region 334. The superhard bearing segments 326a-d may be configured with a serrated geometry at the interior edge regions 334. Such a configuration may allow adjacent superhard bearing segments 326a-d to mate and at least partially interlock, while also defining seams 336 of a geometry that limits fluid leakage radially through the gaps between adjoining superhard bearing segments 326a-d.

The illustrated and described seams between adjacent superhard bearing segments are merely illustrative, and seams between superhard bearing segments and/or configurations of interior edge regions of superhard bearing segments may have any number of configurations. For, instance, a set of interconnecting superhard bearing segments may have substantially straight, serrated, sawtoothed, sinusoidal-like, curved, or otherwise shaped interior edge regions, or any combination of the foregoing. Moreover, some portions of an interior edge region may have one configuration of shape while another portion of an interior edge region on the same superhard bearing segment may have a different configuration or shape. Accordingly, different superhard bearing segments may also include different mating geometry or other configurations.

As discussed herein, a tilting pad bearing assembly may be utilized where certain conditions are met, or in any number of other circumstances or industries. For instance, an application may be identified where it would benefit to use a superhard bearing element including a superhard material; however, the superhard material may have associated production limits (e.g., size, availability, etc.). Where the superhard bearing element has a size, shape, or other feature(s) exceeding such production limits, the superhard bearing element may be fashioned out of multiple individual segments that collectively define a superhard bearing surface of the superhard bearing element. In other cases, however, the type of material used in the superhard bearing element may not have the same production limits as PDCs or other superhard materials, or the superhard bearing element may be sized small enough to allow a single superhard or other material to be used to form the superhard bearing surface. FIG. 4 illustrates an embodiment in which a tilting pad 404 may have a size and/or comprise a material configured such that a single segment may form a substantially continuous superhard bearing surface 416. In particular, the tilting pad 404 may include a superhard table 418 bonded to a substrate 420. The substrate may in turn be bonded to a support plate 422. Optionally, the support plate 422 is oversized relative to the substrate 420; however, the support plate 422 may also be about the same size or smaller than the substrate 420. In this embodiment, a single segment 426 may define substantially the entire superhard bearing surface 416. For instance, the segment 426 may exhibit a length and/or width that may measure approximately 15 mm by 10 mm, such that a single superhard table 418 made from polycrystalline diamond or other materials may be fashioned into the desired shape, even in the absence of providing multiple interlocking, adjoining, or adjacent segments. In other embodiments, the segment 426 may have other sizes and may even exceed a maximum size available for PCDs. For instance, other superhard materials (e.g., tungsten carbide) may be used to form the superhard bearing surface 116 using a single, integral segment.

Figure 5A:
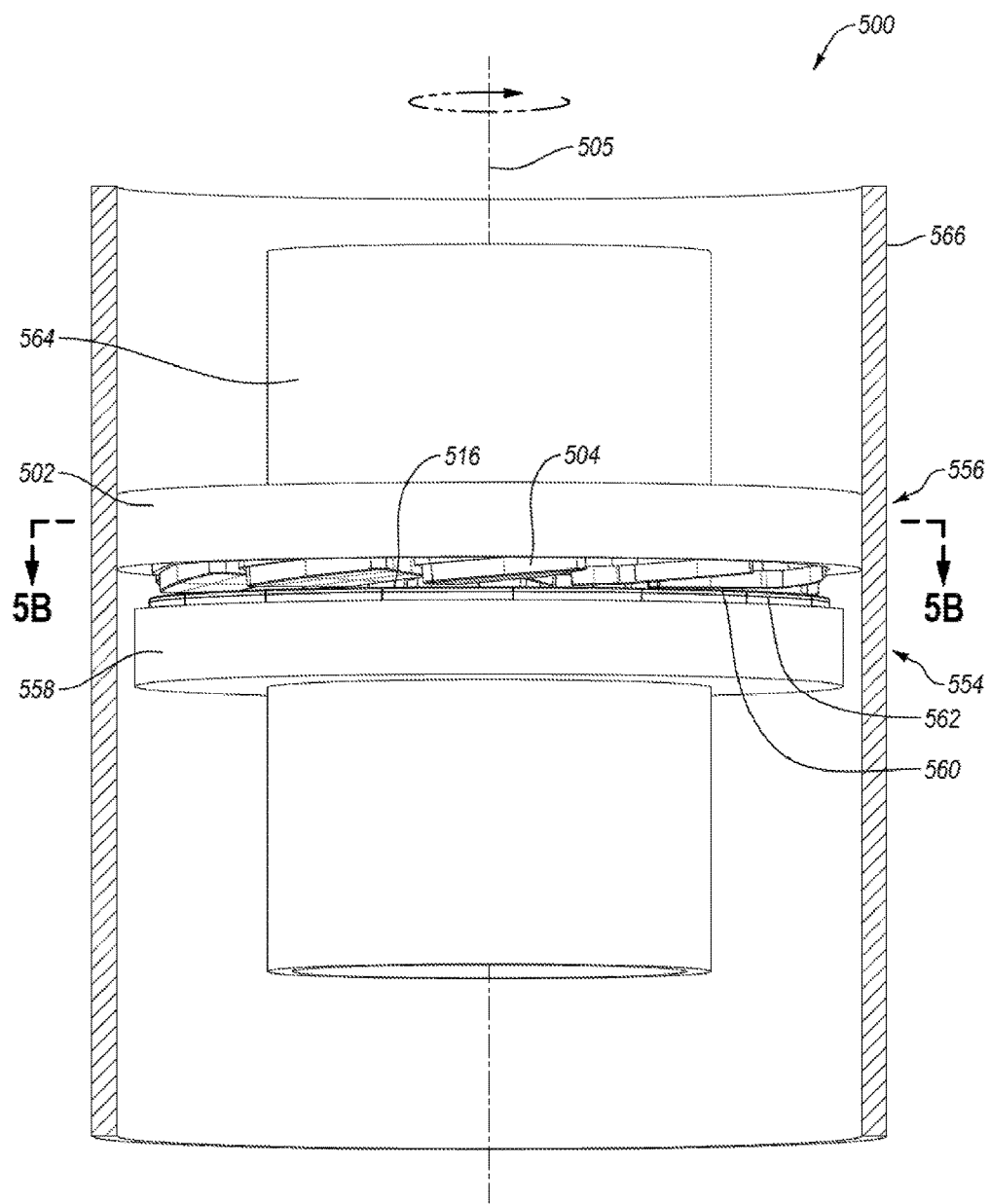
FIG. 5A is an isometric cutaway view of a hydrodynamic tilting pad thrust-bearing apparatus that may employ any of the disclosed hydrodynamic tilting pad thrust-bearing assemblies according to one embodiment, with a housing shown in cross-section.
Figure 5B:
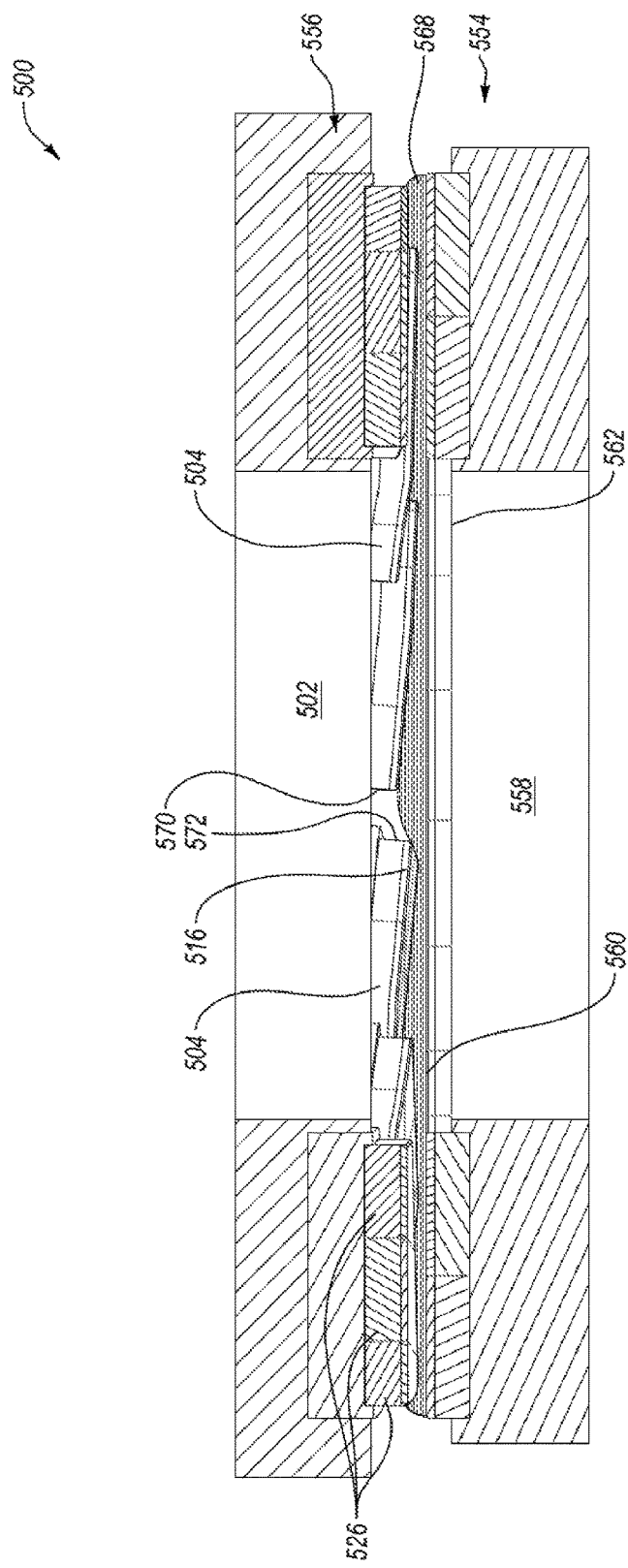
FIG. 5B is an isometric cross-sectional view of the hydrodynamic tilting pad thrust-bearing apparatus taken along line 5B-5B of FIG. 5A showing a fluid film that develops between tilting pads of a stator and a substantially continuous a superhard bearing element of a rotor.

Any of the above-described hydrodynamic tilting pad bearing assembly embodiments may be employed in a hydrodynamic tilting pad bearing apparatus. FIGS. 5A and 5B are isometric cutaway and isometric partial cross-sectional views, respectively, of a hydrodynamic tilting pad thrust-bearing apparatus 500 according to an embodiment. The hydrodynamic tilting pad thrust-bearing apparatus 500 may include a rotor 554 and a stator 556. The stator 556 may be configured as any of the described embodiments of hydrodynamic tilting pad bearing assemblies, or may include any of the described embodiments of superhard bearing elements or tilting pads. The stator 556 may include a support ring 502 and a plurality of tilting pads 504 mounted or otherwise attached to the support ring 502, with each of the tilting pads 504 having a superhard bearing surface 516. The tilting pads 504 may be tilted and/or tilt relative to a rotational axis 505 of the hydrodynamic tilting pad apparatus 500 and/or one or more surfaces of the support ring 502. The tilting pads 504 may be fixed at a particular tilt, may be manually adjusted to exhibit a particular tilt, may self-establish at a particular tilt, or may be otherwise configured. The terms "rotor" and "stator" refer to rotating and stationary components of the tilting pad bearing apparatus 500, respectively, although the rotating and stationary status of the illustrated embodiments may also be reversed. For instance, the support ring 502 and tilting pads 504 may remain stationary while a support ring 558 rotates.

Figure 6A:
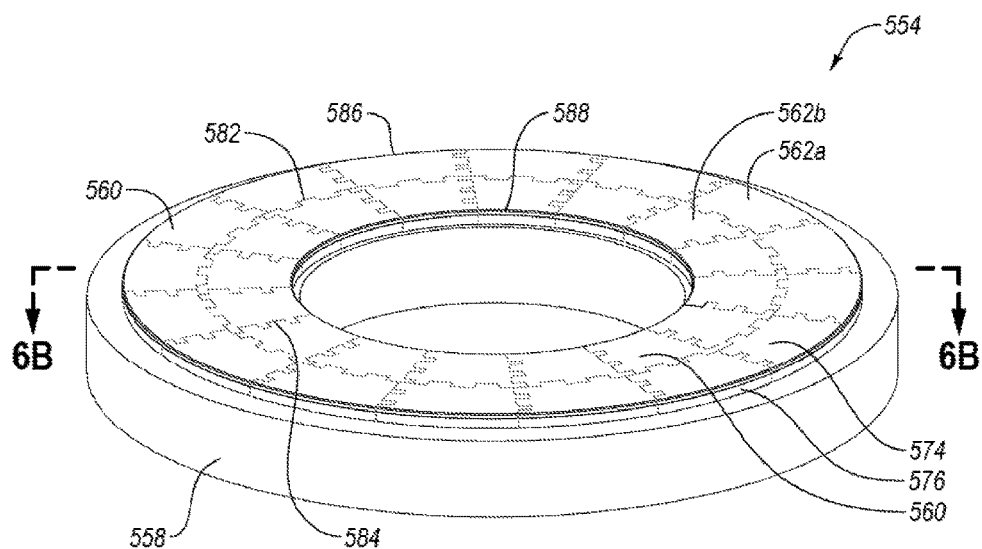
FIG. 6A is an isometric view of a runner of a hydrodynamic tilting pad thrust-bearing assembly according to one embodiment.
Figure 6B:
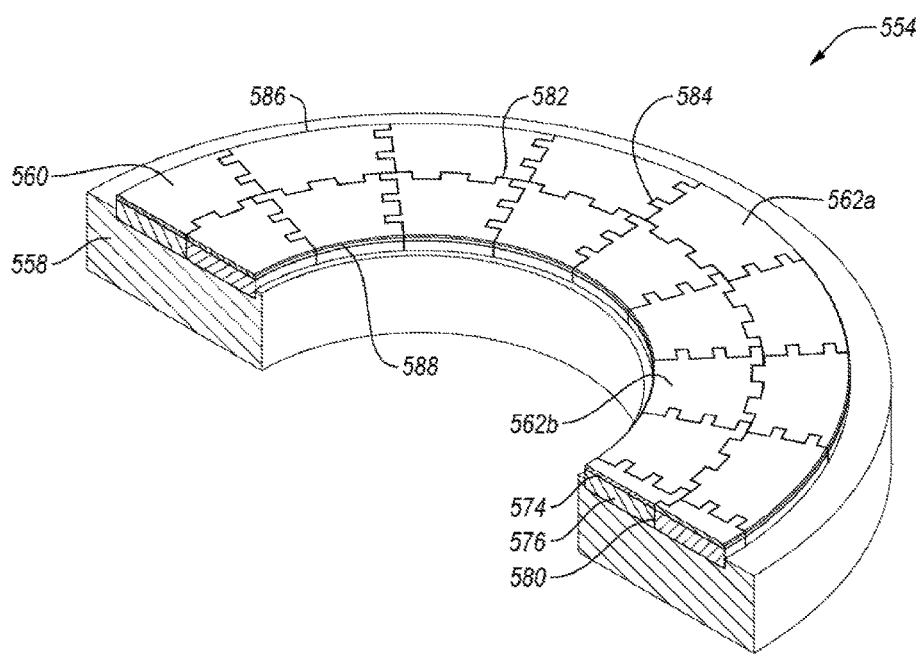
FIG. 6B is an isometric partial cross-sectional view taken along the line 6B-6B of FIG. 6A.

The rotor 554 may be configured in any suitable manner, including in accordance with embodiments described herein. The rotor 554 may include a support ring 558 connected to one or more superhard bearing segments 562. The rotor 554 may include a substantially continuous superhard bearing surface which is generally adjacent the superhard bearing surfaces 516 of the stator 556. A fluid film may be formed between the substantially continuous superhard bearing surface of the rotor 554 and the superhard bearing surfaces 516 of the stator 556. In some embodiments, the superhard bearing surface of the rotor 554 may be formed of a single material and may be formed of a same or different material relative to materials used to form the tilting pad superhard bearing elements 504. In other embodiments, such as shown in FIGS. 6A and 6B, the superhard bearing surface of the rotor 554 may be defined at least partially by a plurality of circumferentially-adjacent superhard bearing segments 562 (e.g., a plurality of superhard compacts), each of which includes an outer superhard bearing surface 560 defining at least a portion of the substantially continuous superhard bearing surface of the rotor 554. The superhard bearing segments 562 may be mounted or otherwise attached to a support ring 558 by brazing, a press-fit, mechanical fasteners, or in another manner.

As shown in FIG. 5A, a shaft 564 may be coupled to the support ring 558 and operably coupled to an apparatus capable of rotating the shaft section 564 in a direction R (or in an opposite direction). An apparatus capable of providing such rotation may include a downhole motor. For example, the shaft 564 may extend through and may be secured to the support ring 558 of the rotor 554 by press-fitting or a threaded connection that couples the shaft 564 to the support ring 502, or by using another suitable technique. A housing 566 may be secured to the support ring 502 of the stator 556 by, for example, press-fitting or threadly coupling the housing 566 to the support ring 502, and may extend circumferentially about the shaft 564, the stator 556, and the rotor 554.

The operation of the hydrodynamic tilting pad bearing apparatus 500 is discussed in more detail with reference to FIG. 5B. FIG. 5B is an isometric partial cross-sectional view in which the shaft 510 and housing 511 are not shown for clarity. In operation, drilling fluid, mud, or some other fluid may be pumped between the shaft 510 and the housing 511, and between the tilting pads 504 of the stator 556 and the superhard bearing segments 562 of the rotor 554. More particularly, rotation of the rotor 554 at a sufficient rotational speed may sweep the fluid onto superhard bearing surfaces 516 of the stator 556 and may allow a fluid film 568 to develop between the superhard bearing surfaces 560 of the rotor 554 and the superhard bearing surfaces 516 of the stator 556. The fluid film 568 may develop under certain operational conditions in which the rotational speed of the rotor 556 is sufficiently great and the thrust load is sufficiently low.

The stator 556 may include tilting pads 504 that are optionally made of multiple segments 526. Moreover, in at least some embodiments, the tilting pads 504 may be configured to tilt as described herein. In such an embodiment, the tilting pads 504 may be positioned at a fixed tilt angle or at a configurable or self-establishing tilt angle. The tilting pads 504 of the stator 556 may have a leading edge 570 at a different position than a trailing edge 572 relative to the rotor 554. For instance, in FIG. 5B, the tilting pads 504 may be tilted such that a greater separation exists between the tilting pads 504 and the superhard bearing segments 562 at the leading edge 570 than at the trailing edge 572. Under such circumstances, the lubricant film 568 may have a variable thickness across the tilting pad 504. In this particular embodiment, a higher lubricant film thickness may exist at the leading edge 570 than at the trailing edge 572.

Under certain operational conditions, the pressure of the fluid film 568 may be sufficient to substantially prevent contact between the superhard bearing surfaces 560 of the rotor 554 and the superhard bearing surfaces 516 of the stator 556 and may thus substantially reduce wear of the superhard bearing segments 562 and the tilting pads 504. When the thrust loads exceed a certain value and/or the rotational speed of the rotor 554 is reduced, the pressure of the fluid film 568 may not be sufficient to substantially prevent the superhard bearing surfaces 560 of the rotor 554 and the superhard bearing surfaces 516 of the stator 556 from contacting each other. Under such operational conditions, the hydrodynamic tilting pad bearing apparatus 500 is not operated as a hydrodynamic bearing. Thus, under certain operational conditions, the hydrodynamic tilting pad bearing apparatus 500 may be operated as a hydrodynamic bearing apparatus and under other conditions the hydrodynamic tilting pad bear apparatus 500 may be operated so that the superhard bearing surfaces 516, 560 contact each other during use or a partially developed fluid film is present between the superhard bearing surfaces 516, 560. However, the tilting pads 504 and superhard bearing segments 562 may comprise superhard materials that are sufficiently wear-resistant to accommodate repetitive contact with each other, such as during start-up and shut-down of a subterranean drilling or other system employing the hydrodynamic tilting pad bearing apparatus 500 or other operational conditions not favorable for forming the fluid film 568. In still other embodiments, a backup roller or other bearing (not shown) may also be included for use during certain operational conditions, such as during start-up, or as the fluid film 558 develops.

FIGS. 6A and 6B illustrate top isometric views and isometric partial cross-sectional views, respectively, of the rotor 554 and illustrate an embodiment of a configuration of multiple superhard bearing segments 562a, 562b in more detail. In particular, in the illustrated embodiment, the superhard bearing segments 562a, 562b may be a superhard compact (e.g., a PDC) that includes a superhard table 574 bonded to a substrate 576. Each superhard table 574 may include a superhard bearing surface 560. The superhard bearing surfaces 560 of the superhard tables 574 may collectively form a substantially continuous superhard bearing surface of the stator 556.

An example manner in which the superhard bearing segments 562a, 562b may be assembled together is illustrated in FIGS. 6A and 6B; however, in other embodiments, multiple segments may be assembled together in other manners, using differing geometries, or using a single material rather than a set of multiple segments. In the illustrated embodiment, the superhard bearing segments 562a, 562b may extend circumferentially in a generally circular manner, and may be secured to the support ring 558 using a brazing, press-fit, fastener, or other attachment mechanism. There may be a plurality of outer segments 562a and a plurality of inner segments 562b. The outer segments 562a may include, in some embodiments, an outer edge section 586 and at least one interior edge section 588. The outer edge sections 586 of the collective set of outer segments 562 may define all or a portion of the outermost edge of the superhard bearing surface 560. Similarly, the inner segments 562b may include, in some embodiments, an inner edge section 588 and at least one outer edge section 586. The outer edge sections 588 of the collective set of inner segments 562b may define all or a portion of the innermost edge of the superhard bearing surface 560. For instance, the innermost edge of the superhard bearing surface 560 may bear against a shaft (see FIG. 5A).

The interior edge sections 584 of the superhard bearing segments 562a, 562b may interconnect with, or otherwise correspond to, other of the multiple superhard bearing segments 562a, 562b. For instance, in the illustrated embodiment, each outer superhard bearing segment 562a may connect at opposing ends to other outer superhard bearing segments 562a that extend circumferentially relative thereto. Each outer superhard bearing segment 562a may also interface or mesh with one or more inner superhard bearing segment 562b which extend radially inward relative to the outer superhard bearing segment 562a. Such an arrangement is, however, merely exemplary. In other embodiments, there may be more than two superhard bearing segments extending radially to form the substantially continuous superhard bearing surface, any number of different segments extending circumferentially to form the substantially continuous superhard bearing surface, or a superhard bearing segment may interface with a segment extending at least partially in both circumferential and radial directions with respect thereto. Accordingly, a substantially continuous superhard bearing surface may be formed by a collective set of superhard bearing segments 562a, 562b each having a respective superhard bearing surfaces 560, and such superhard bearing segments 562a, 562b may be arranged, connected, or shaped in any suitable manner.

In FIGS. 6A and 6B, each of the interior edge sections 584 may have an alternating slot-and-ridge pattern, although such a configuration is merely illustrative. In other embodiments, the interior edge sections 584 may exhibit any of the previously described geometries, such as a serrated, straight, curved, or other geometry. Such geometries may enable mating adjacent superhard bearing segments together and/or limiting of fluid leakage through seams between adjacent superhard bearing segments.

Accordingly regardless of the particular arrangement, multiple segments form the substantially continuous superhard bearing surface of the stator 556, a set of seams 582 may form between adjoining segments 562a, 562b. The seams 582 may provide a tortuous or winding path that limits fluid leakage radially through the seams 582. The seams 582 may correspond to a relatively small gap 580 existing between the segments 562a, 562b. Although not necessary, the size of the gaps 580 may be the same or similar to those described previously with respect to exemplary tilting pad superhard bearing elements. For instance, the gaps 580 may have a width of about 0.001 mm to about 3.5 mm, more particularly a width of about 0.0025 mm to about 2.5 mm, and more particularly a width of about 0.125 mm to about 1.25 mm. More particularly still, the gaps 580 may have a width from about 0.005 mm up to about 1.0 mm. The gaps 580 are optionally filled with a sealant material as described herein.

Figure 7A:
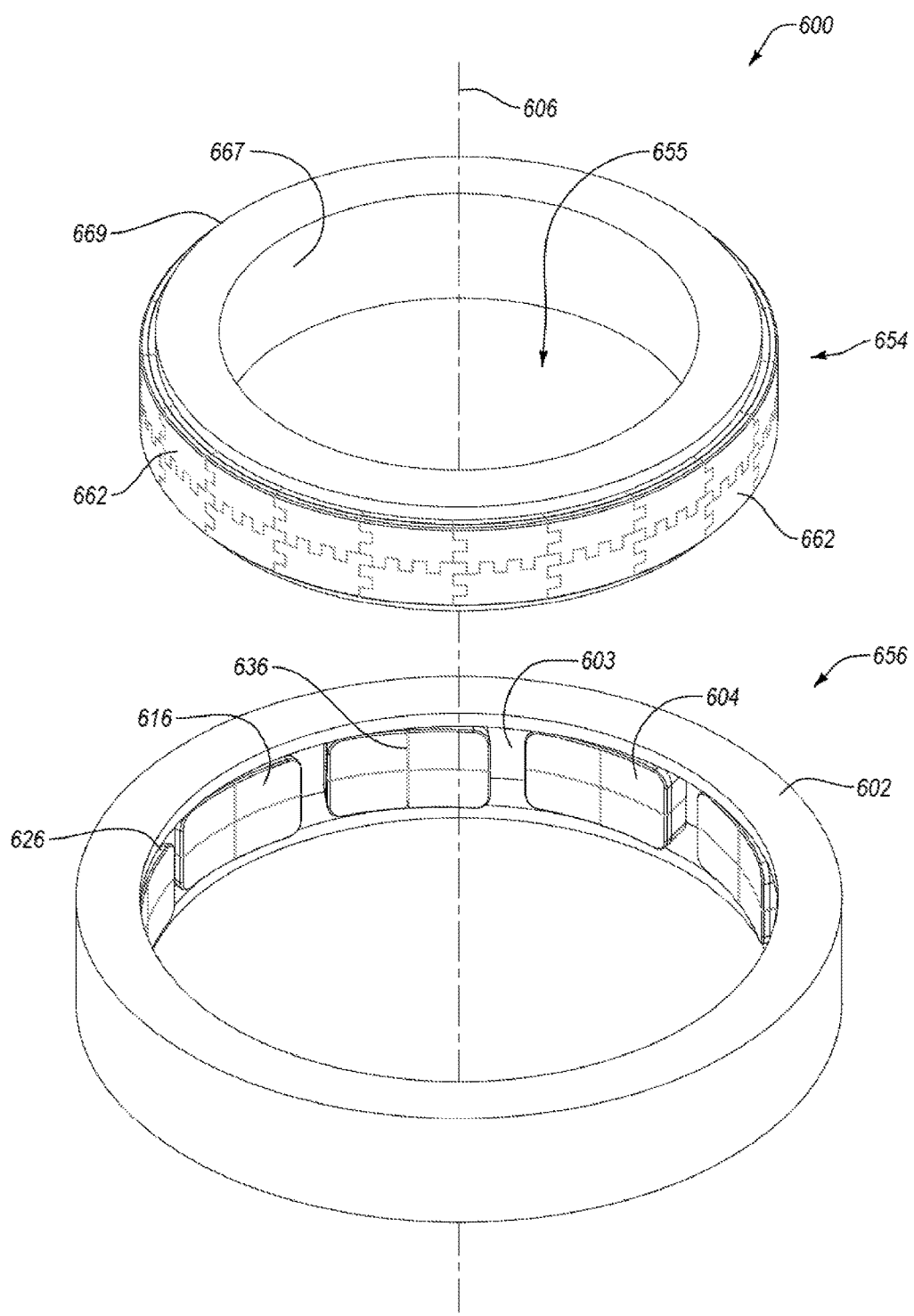
FIG. 7A is an exploded isometric view of a hydrodynamic tilting pad radial bearing apparatus that may use teachings of any of the disclosed hydrodynamic tilting pad thrust-bearing assemblies according to an embodiment.
Figure 7B:
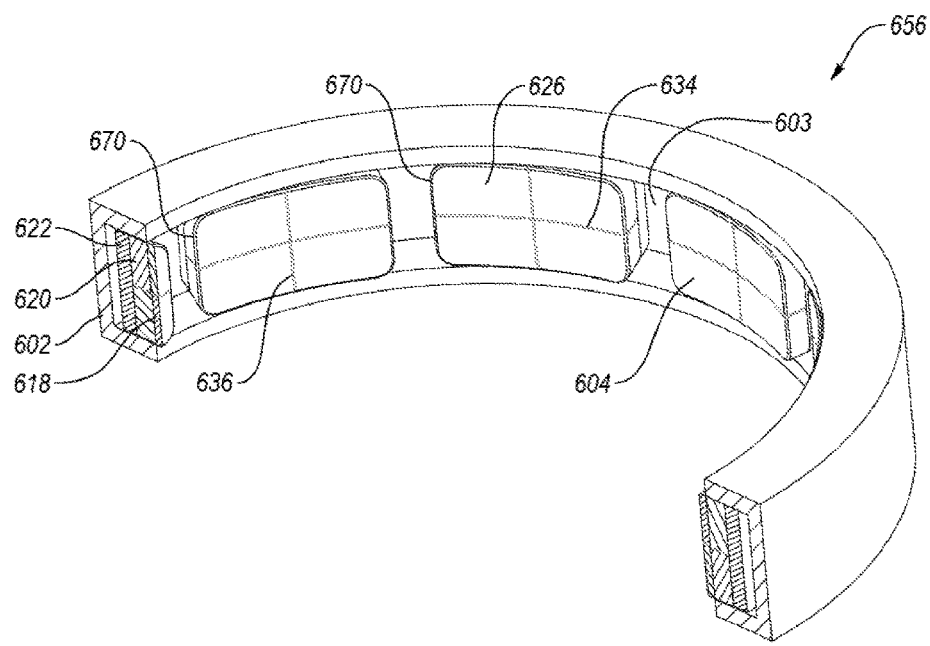
FIG. 7B is an isometric partial cross-sectional view of radial tilting pad stator of the hydrodynamic tilting pad radial bearing apparatus of FIG. 7A according to an embodiment.
Figure 7C:
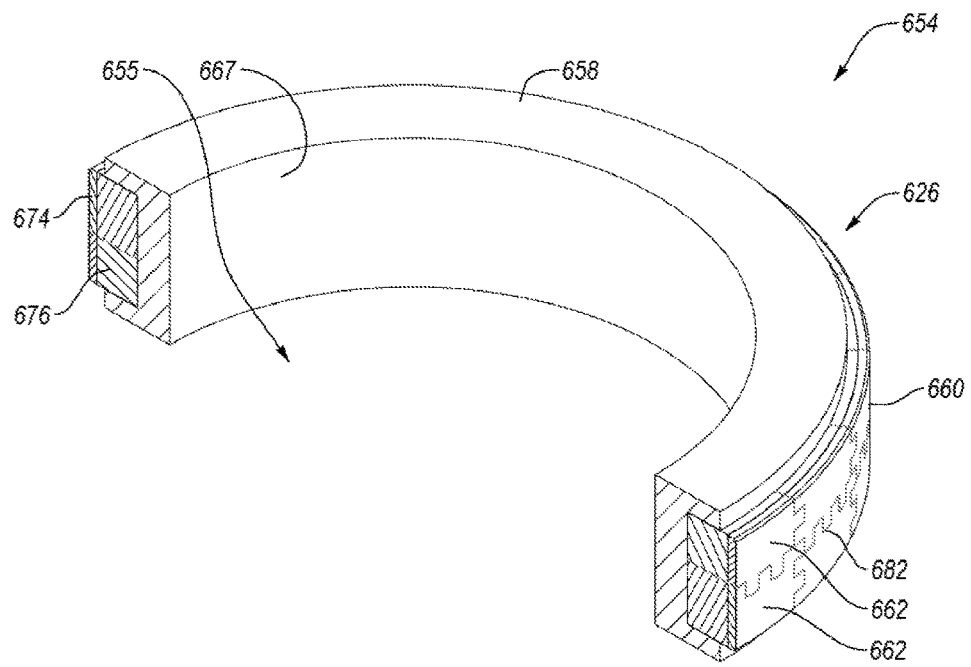
FIG. 7C is an isometric partial cross-sectional view of a rotor of the hydrodynamic tilting pad radial bearing apparatus of FIG. 7A according to an embodiment.

The concepts used in the hydrodynamic tilting pad bearing assemblies and apparatuses described herein may also be employed in tilting pad radial bearing assemblies and apparatuses. FIGS. 7A to 7C are isometric, exploded, and isometric partial cross-sectional views, respectively, of a hydrodynamic tilting pad radial bearing apparatus 600 according to yet another embodiment. The hydrodynamic tilting pad radial bearing apparatus 600 may include an inner race 654 (e.g., a runner or rotor) that may have an interior surface 667 defining an opening 655 for receiving a shaft or other component. The inner race 654 may also include a plurality of circumferentially and/or longitudinally adjacent superhard bearing segments 662 (e.g., a plurality of superhard compacts) at or near an exterior surface 669 of the inner race 654, each of which may include a convexly-curved superhard bearing surface 660.

The hydrodynamic tilting pad radial bearing apparatus 600 may further include an outer race 656 (e.g., a stator)

configured to extend about and/or receive the inner race 654. The outer race 656 may include a plurality of circumferentially-spaced tilting pads 604, each of which may include a superhard bearing surface 616. The superhard bearing surface 616 may be substantially planar, although in other embodiments the superhard bearing surface 616 may be a concavely-curved superhard bearing surface to generally correspond to shapes of convexly-curved superhard bearing surfaces of the inner race 654. The terms "rotor" and "stator" refer to rotating and stationary components of the radial bearing system 600, respectively. Thus, if the inner race 654 is configured to remain stationary, the inner race 654 may be referred to as the stator and the outer race 656 may be referred to as the rotor.

The hydrodynamic tilting pad radial bearing apparatus 600 may be employed in a variety of mechanical applications. For example, rotary drill bits may benefit from a radial bearing apparatus disclosed herein. More specifically, the inner race 654 may be mounted or affixed to a spindle of a rotary drill bit and the outer race 656 may be affixed to an inner bore such that an outer race 656 and inner race 654 may be assembled to form the radial bearing system 600.

With continued reference to FIG. 7A, rotation of a shaft (not shown) secured to the inner race 654 may effect rotation of the inner race 654 relative to the outer race 656. Drilling fluid or other fluid or lubricant may be pumped between the superhard bearing surfaces 616 of the inner race 654 and the superhard bearing surfaces 660 of the outer race 656. When the inner race 654 rotates, the leading edge sections 670 of the tilting pads 604 may sweep lubricant (e.g., drilling fluid or other lubricant) onto the superhard bearing surfaces 660 of the outer race 656. As previously described with respect to the hydrodynamic tilting pad bearing apparatus 500, at sufficient rotational speeds for the inner race 654, a fluid film may develop between the superhard bearing surfaces 616, 660 of the tilting pads 604 and the superhard bearing segments 662, and may develop sufficient pressure to maintain the superhard bearing surfaces 616 and the superhard bearing surfaces 660 apart from each other. Accordingly, wear on the tilting pads 604 and superhard bearing segments 662 may be reduced compared to when direct contact between the tilting pads 604 and superhard bearing segments 662 occurs.

As further illustrated in FIGS. 7A and 7B, the outer race 656 includes a support ring 602 extending about an axis 606. The support ring 602 may include an interior channel 603 configured to receive a set of tilting pad superhard bearing elements 604 distributed circumferentially about the axis 606. Each tilting pad 604 may comprise a superhard table 618 including a superhard bearing surface 616. The superhard bearing surface 616 may be curved (e.g., concavely-curved) or substantially planar and, in some embodiments, may include a peripheral chamfer. In other embodiments, the superhard bearing surface 616 may be otherwise curved, lack a chamfered edge, may have another contour or configuration, or any combination of the foregoing. Each superhard table 618 may be bonded to a corresponding substrate 620. Further, each superhard bearing surface 616 may be tilted circumferentially relative to an imaginary cylindrical surface. The superhard tables 618 and substrates 620 may be fabricated from the same materials described above for the tilting pads 104 shown in FIGS. 1A and 1B.

Each superhard bearing surface 616 of a corresponding tilting pad 604 may be tilted in a manner that facilities sweeping in of a lubricant or other fluid to form a fluid film between the inner race 654 and the outer race 656. Each tilting pad 604 may be tilted and/or tilt about an axis that is generally parallel to the central axis 606. As a result, each tilting pad 604 may be tilted at an angle relative to the inner and outer surfaces of the ring 602 and in a circumferential fashion such that the leading edges 670 of the tilting pads 604 are about parallel to the central axis 606. The leading edge 670 may help to sweep lubricant or another fluid onto the superhard bearing surfaces 616 of the stator 656 to form a fluid film in a manner similar to the tilting pads 504 shown in FIGS. 5A and 5B. More particularly, when the inner race 654 is concentrically positioned relative to the outer race 656, the leading edges 670 may be offset relative to the outer edge 669 of the outer race 656, and by a distance that is larger than a distance between the outer race 656 and a trailing edge of the superhard bearing elements 604. It should be noted that in other embodiments, the radial bearing apparatus 600 may be configured as a journal bearing. In such an embodiment, the inner race 654 may be positioned eccentrically relative to the outer race 656.

In some embodiments, the tilting pad 604 may be formed from a plurality of superhard bearing segments 626 that collectively define a respective tilting pad 604 and/or superhard bearing surface 616. Each superhard bearing segment 626 may be substantially identical, or the superhard bearing segments 626 may be different relative to other of the superhard bearing segments 626. In some embodiments, the superhard bearing segments 626 each include a superhard table 618 bonded to a substrate 620 as described herein. Optionally, the substrate 620 may be connected or supported relative to a support plate 622, the support ring 602, or other material or component. The support plate 622 may be a single component or segment and used to facilitate assembly of the multiple segments 626 into the superhard bearing element 604, although in other embodiments the support plate 622 may also include multiple assembled segments.

With continued reference to FIGS. 7A and 7B, the seams 636 may be formed between circumferentially and/or longitudinally adjacent to the superhard bearing elements 604. As with the hydrodynamic tilting pad bearing assembly 100 described above, the edges of the superhard bearing segments 626 may have any number of configurations or shapes, and may correspond to or interlock with adjoining edges in any number of different manners. Further, sealant materials may be disposed within a gap (not shown) that may be formed between adjacent superhard bearing segments 662 to help further prevent fluid leakage through the seams 636.

As further illustrated in FIGS. 7A and 7C, the inner race 654 of the radial bearing apparatus 600 is shown with a support ring 658 connected to a plurality of circumferentially and longitudinally-adjacent superhard bearing segments 662 assembled together to form a substantially continuous superhard bearing element 626 and substantially continuous superhard bearing surface. In other embodiments, an outer race of a radial bearing system may include a plurality superhard bearing segments that are only circumferentially spaced around the inner race 654, or a plurality of superhard bearing segments that are only longitudinally spaced with respect to the inner race 654. In still other embodiments, the inner race 654 may define a superhard bearing surface that is formed from only a single segment, such that there are not multiple segments assembled together. For instance, a single segment may be used where the size of the inner race 654 is sufficiently small that the material forming the superhard bearing surface 660 may be formed as a single material. Under some conditions, such as where a material forming the superhard bearing surface has limited production constraints, the superhard bearing surface 660 may be formed from multiple segments.

As noted previously, the plurality of superhard bearing segments 662 may be distributed circumferentially and/or longitudinally relative to the axis 606. Where the superhard bearing segments 662 include a superhard table 674 and/or a substrate 676, the superhard tables 674 and substrates 676 may be fabricated from the same materials described above for the superhard bearing segments 104 shown in FIGS. 1A to 1D. One or more seams 682 may be formed between adjacent superhard bearing segments 662. As with the tilting pad bearing assembly 100 described above, the seams may follow slot-and-ridge, serrated, straight, curved or other edge geometries. Further, if desired, any of the previously described sealant materials may be disposed within a gap (not shown) that may be formed between adjacent superhard bearing segments 662 to help further prevent fluid leakage through the seams 682.

The support ring 658 of the inner race 654 may include a circumferentially extending recess configured to receive the plurality of superhard bearing segments 662. The superhard bearing segments 662 may be secured within the recess or otherwise secured to the support ring 658 by brazing, press-fitting, using fasteners, or another suitable technique. The support ring 658 may also define an interior surface 667 defining an opening 655 that is capable of receiving, for example, a shaft of a motor from a downhole motor assembly or other apparatus.

Figure 8:
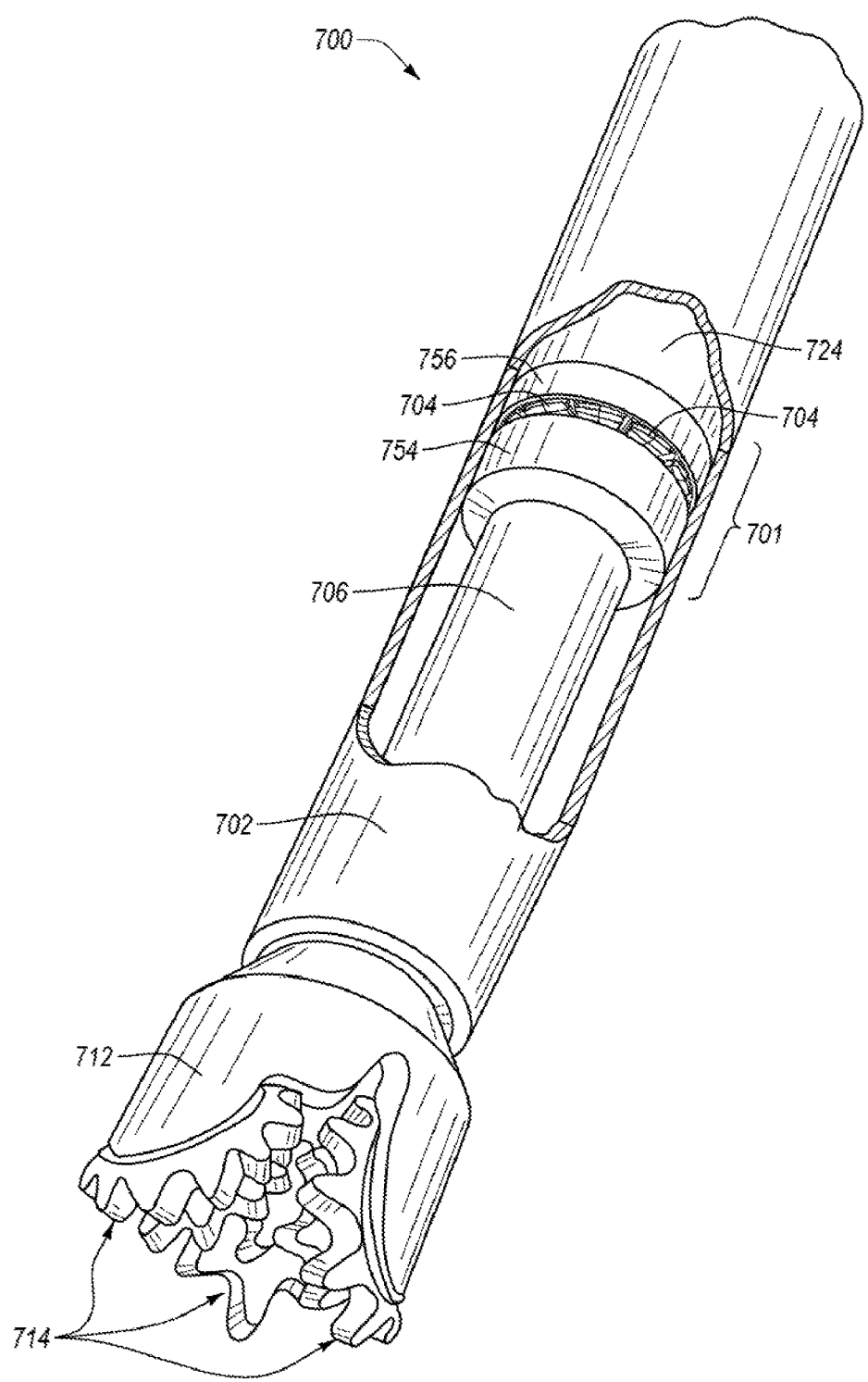
FIG. 8 is a schematic isometric cutaway view of a subterranean drilling system including one of the disclosed hydrodynamic tilting pad thrust-bearing apparatuses according to an embodiment.

Any of the embodiments for bearing apparatuses discussed above may be used in a subterranean drilling system. FIG. 8 is a schematic isometric cutaway view of a subterranean drilling system 700 according to an embodiment, which uses a hydrodynamic tilting pad bearing apparatus 701. The subterranean drilling system 700 may include a housing 702 enclosing a downhole drilling motor 724 (e.g., a motor, turbine, or any other device capable of rotating an output shaft) that is operably connected to an output shaft 706. A hydrodynamic tilting pad bearing apparatus 701 may be operably coupled to the downhole drilling motor 724. The hydrodynamic tilting pad bearing apparatus 701 may be configured as any of the previously described hydrodynamic tilting pad bearing apparatus or radial bearing apparatus embodiments. A rotary drill bit 712 may be configured to engage a subterranean formation and drill a borehole and may be connected to the output shaft 706. The rotary drill bit 712 is depicted as a roller cone bit including a plurality of roller cones 714. However, other embodiments may utilize different types of rotary drill bits, such as fixed cutter bits, core bits, eccentric bits, bi-center bits, reamers, reamer wings, or any other downhole tool. As the borehole is drilled, pipe sections may be connected to the subterranean drilling system 700 to form a drill string capable of progressively drilling the borehole to a greater depth within an earthen formation.

The tilting pad bearing apparatus 701 may include a stator 756 that does not rotate and a rotor 754 that may be attached to the output shaft 706 and may rotate with the output shaft 706. The rotor 754 optionally includes a plurality of adjacent superhard bearing segments (not shown) assembled together to form a substantially continuous superhard bearing element, as previously described such as in the stator 654 shown in FIGS. 7A and 7C. The stator 756 may include a plurality of superhard bearing elements 704 circumferentially spaced around the stator 756. The superhard bearing elements 704 may in some embodiments include tilting pads or other superhard bearing elements, such as tilting pads 104, 204, 304, 404, 504, or 604 as described previously herein.

In operation, drilling or other fluid may be circulated through the downhole drilling motor 724 to generate torque and effect rotation of the output shaft 706 and the rotary drill bit 712 attached thereto so that a borehole may be drilled. A portion of the fluid may also be used to lubricate opposing superhard bearing surfaces of the stator 756 and rotor 754. When the rotor 754 is rotated at a sufficient rotational speed, the fluid may be swept onto the superhard bearing surfaces of the stator 756 and a fluid film having sufficient pressure may develop that maintains the superhard bearing surfaces of the stator 756 and the superhard bearing surfaces of the rotor 754 apart, as previously discussed. In embodiments in which the superhard bearing surfaces of the stator 756 are tilted such as in the case of example tilting pad bearing assemblies, the tilted superhard bearing surfaces may facilitate formation of a film thickness having different thicknesses at leading and trailing edges of the superhard bearing elements 704.

Although the bearing assemblies and apparatuses described above have been discussed in the context of subterranean drilling systems and applications, in other embodiments, the bearing assemblies and apparatuses disclosed herein are not limited to such use and may be used for many different applications, if desired, without limitation. Thus, such bearing assemblies and apparatuses are not limited for use with subterranean drilling systems and may be used with various other mechanical systems, without limitation.

While various aspects and embodiments have been disclosed herein, other aspects and embodiments are contemplated. The various aspects and embodiments disclosed herein are for purposes of illustration and are not intended to be limiting. Additionally, the words "including," "having," and variants thereof (e.g., "includes" and "has") as used herein, including the claims, shall be open ended and have the same meaning as the word "comprising" and variants thereof (e.g., "comprise" and "comprises").

The invention claimed is:

1. A bearing apparatus, comprising:
   a runner including at least one runner superhard bearing surface comprising a chemically-vapor-deposited carbide material; and
   a bearing assembly including:
      a support ring; and
      a plurality of tilting pads each of which includes at least one polycrystalline diamond bearing element having a cemented carbide substrate bonded to a polycrystalline diamond table, the polycrystalline diamond table including a tilting pad superhard bearing surface.

2. The bearing apparatus of claim 1, wherein the chemically-vapor-deposited carbide material includes tungsten carbide.

3. The bearing apparatus of claim 2, wherein the tungsten carbide includes a binderless tungsten carbide.

4. The bearing apparatus of claim 1, wherein the runner includes a plurality of superhard bearing elements defining the at least one runner superhard bearing surface and a plurality of seams therebetween that are at least partially filled with the chemically-vapor-deposited carbide material.

5. The bearing apparatus of claim 1, wherein the plurality of tilting pads are decoupled from one another.

6. The bearing apparatus of claim 1, wherein the bearing assembly includes a plurality of pins each of which at least one of tiltably supports a respective tilting pad of the plurality of tilting pads or supports the respective tilting pad in a tilted position and secures the respective tilting pad to the support ring.

7. The bearing apparatus of claim 6, further comprising a plurality of support plates each of which is attached to a respective pin of the plurality of pins.

8. The bearing apparatus of claim 7, wherein each of the plurality of tilting pads is secured to a respective support plate of the plurality of support plates.

9. The bearing apparatus of claim 7, wherein each of the plurality of support plates includes a pocket, and each of the plurality of tilting pads is secured within a respective pocket of the plurality of pockets.

10. The bearing apparatus of claim 1, wherein each of the runner superhard bearing surface and the tilting pad superhard bearing surface is substantially planar.

11. The bearing apparatus of claim 1, wherein each of the runner superhard bearing surface and the tilting pad superhard bearing surface is non-planar.

12. The bearing apparatus of claim 1, wherein each of the plurality of tilting pads is tiltable about a respective tilt axis.

13. The bearing apparatus of claim 12, wherein the respective tilt axis is a radial axis relative to the support ring.

14. The bearing apparatus of claim 12, wherein the respective tilt axis is substantially parallel to a rotation axis of the support ring.

15. The bearing apparatus of claim 1, wherein each of the plurality of tilting pads includes a fixed tilting pad, an adjustable tilting pad, or a self-establishing tilting pad.

16. A bearing apparatus, comprising:
a rotor including at least one rotor superhard bearing surface comprising a chemically-vapor-deposited carbide material; and
a stator including a plurality of tilting pads decoupled from one another, each of the plurality of tilting pads includes at least one polycrystalline diamond bearing element having a tilting pad superhard bearing surface.

17. A bearing apparatus, comprising:
a rotor including at least one rotor superhard bearing surface comprising a vapor-deposited carbide material; and
a stator including:
a support ring; and
a plurality of tilting pads each of which includes at least one polycrystalline diamond bearing element having a cemented carbide substrate bonded to and a polycrystalline diamond table, the polycrystalline diamond table including a tilting pad superhard bearing surface.

18. The bearing apparatus of claim 17, wherein the vapor-deposited carbide material includes a chemically-vapor-deposited carbide material.

19. The bearing apparatus of claim 18, wherein the chemically-vapor-deposited carbide material includes tungsten carbide.

20. The bearing apparatus of claim 19, wherein the tungsten carbide includes a binderless tungsten carbide.

* * * * *